US012672228B2

(12) United States Patent
Kwon et al.

(10) Patent No.: US 12,672,228 B2
(45) Date of Patent: Jun. 30, 2026

(54) CIRCUIT BOARD AND SEMICONDUCTOR PACKAGE COMPRISING SAME

(71) Applicant: LG INNOTEK CO., LTD., Seoul (KR)

(72) Inventors: Myung Jae Kwon, Seoul (KR); Sang Hyuck Nam, Seoul (KR); Sang Hyun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 345 days.

(21) Appl. No.: 18/293,695

(22) PCT Filed: Jul. 29, 2022

(86) PCT No.: PCT/KR2022/011241
§ 371 (c)(1),
(2) Date: Jan. 30, 2024

(87) PCT Pub. No.: WO2023/008967
PCT Pub. Date: Feb. 2, 2023

(65) Prior Publication Data
US 2024/0349419 A1 Oct. 17, 2024

(30) Foreign Application Priority Data
Jul. 30, 2021 (KR) ........................ 10-2021-0100986

(51) Int. Cl.
*H05K 1/02* (2006.01)
*H05K 1/11* (2006.01)

(52) U.S. Cl.
CPC ........... *H05K 1/0271* (2013.01); *H05K 1/111* (2013.01)

(58) Field of Classification Search
CPC ........ H05K 1/0271; H05K 1/111; H05K 3/10; H05K 3/28; H05K 3/101; H05K 1/02; H05K 1/11
(Continued)

(56) References Cited

U.S. PATENT DOCUMENTS 6,384,344 B1 5/2002 Asai et al.
8,294,034 B2 * 10/2012 Tseng ..................... H05K 3/465
174/266
(Continued)

FOREIGN PATENT DOCUMENTS

CN 109729639 A 5/2019
JP 9-18097 A 1/1997
(Continued)

*Primary Examiner* — Angel R Estrada
(74) *Attorney, Agent, or Firm* — Birch, Stewart, Kolasch & Birch, LLP

(57) ABSTRACT

A circuit board according to an embodiment includes a first insulating layer; a first circuit pattern disposed on the first insulating layer; and a second insulating layer disposed on the first insulating layer and having a width narrower than that of the first insulating layer; wherein an upper surface of the first insulating layer includes a first region vertically overlapping with the second insulating layer, and a second region excluding the first region, wherein the first circuit pattern includes an extension portion extending from the first region to the second region; and wherein a width of the extension portion in the second region is greater than a width of at least a part of the extension portion in the first region.

20 Claims, 24 Drawing Sheets

(58) Field of Classification Search
USPC ........ 174/251, 250, 260, 261, 266; 257/211, 257/499, 686, 758
See application file for complete search history.

(56) References Cited

U.S. PATENT DOCUMENTS

| | | | | |
|---|---|---|---|---|
| 8,330,047 | B2 * | 12/2012 | Ho | H05K 1/0219 |
| | | | | 174/250 |
| 8,674,232 | B2 * | 3/2014 | Cho | H05K 1/188 |
| | | | | 174/250 |
| 10,076,038 | B2 * | 9/2018 | Park | H05K 1/185 |
| 10,103,113 | B2 * | 10/2018 | Ko | H05K 3/0026 |
| 10,849,225 | B1 * | 11/2020 | Ko | H05K 3/062 |
| 11,089,682 | B2 | 8/2021 | Lee et al. | |
| 11,553,599 | B2 | 1/2023 | Wu | |
| 11,729,910 | B2 * | 8/2023 | Ko | H05K 1/111 |
| | | | | 174/261 |
| 11,943,877 | B2 * | 3/2024 | Lin | H05K 3/4673 |
| 12,144,116 | B2 | 11/2024 | Shin et al. | |
| 12,167,540 | B2 | 12/2024 | Yang et al. | |
| 12,453,012 | B2 * | 10/2025 | Yoo | H05K 1/185 |
| 12,501,545 | B2 * | 12/2025 | Na | H05K 1/03 |
| 2014/0209361 | A1 | 7/2014 | Nakai et al. | |
| 2020/0084888 | A1 | 3/2020 | Lee et al. | |
| 2020/0205300 | A1 | 6/2020 | Wu | |
| 2022/0346236 | A1 | 10/2022 | Yang et al. | |
| 2022/0377902 | A1 | 11/2022 | Shin et al. | |
| 2025/0031312 | A1 | 1/2025 | Shin et al. | |

FOREIGN PATENT DOCUMENTS

| | | | |
|---|---|---|---|
| JP | 2009-206409 | A | 9/2009 |
| JP | 2014-150091 | A | 8/2014 |
| JP | 2019-62235 | A | 4/2019 |
| KR | 10-0866532 | B1 | 11/2008 |
| KR | 10-2011-0010427 | A | 2/2011 |
| KR | 10-2013-0071878 | A | 7/2013 |
| KR | 10-2020-0030411 | A | 3/2020 |
| KR | 10-2021-0046978 | A | 4/2021 |
| KR | 10-2021-0056043 | A | 5/2021 |
| TW | 201444440 | A | 11/2014 |
| WO | WO2021/049859 | A1 | 3/2021 |

* cited by examiner

【FIG. 1a】
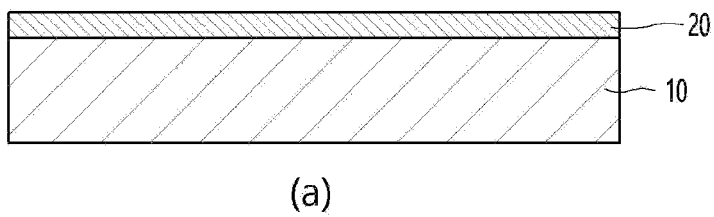
(a)
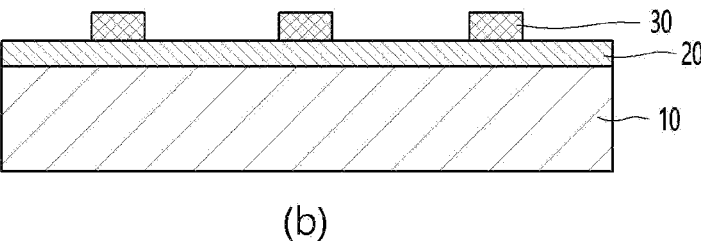
(b)
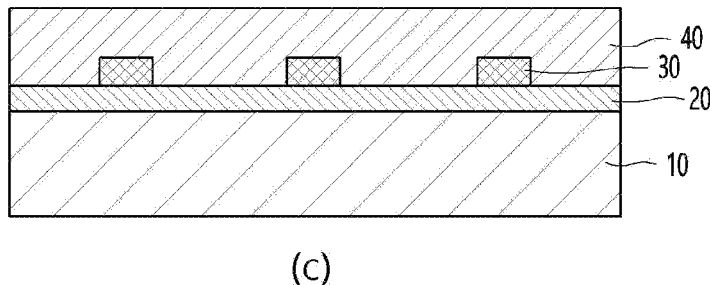
(c)

【FIG. 1b】
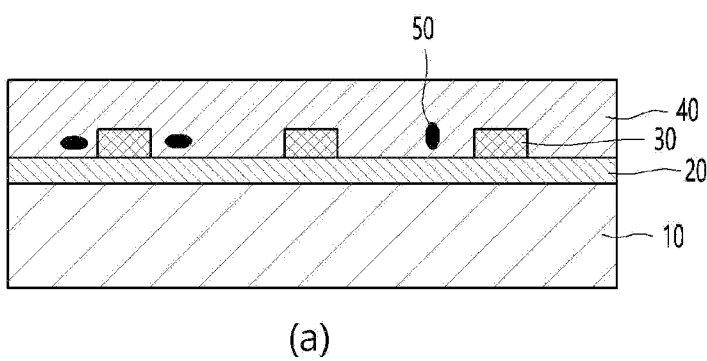
(a)
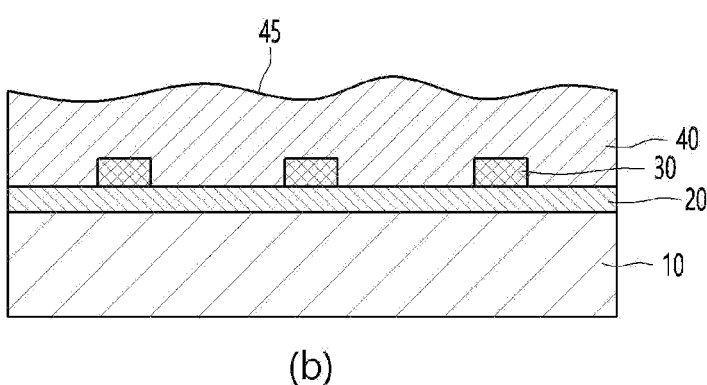
(b)

【FIG. 2a】
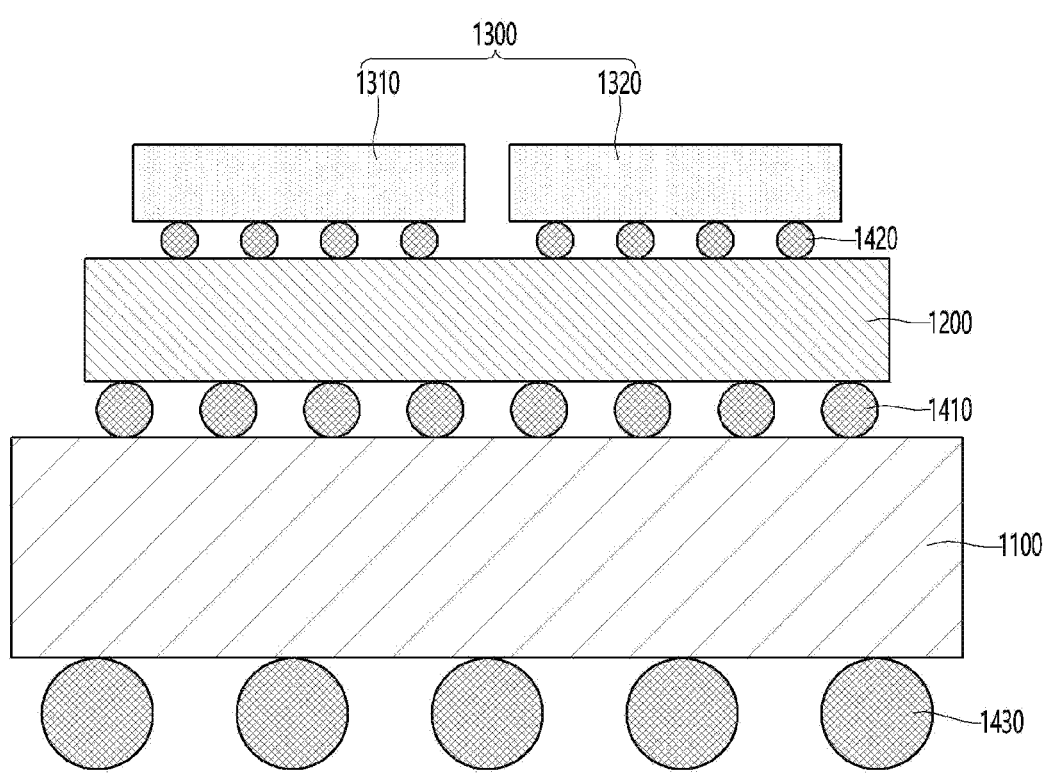

【FIG. 2b】
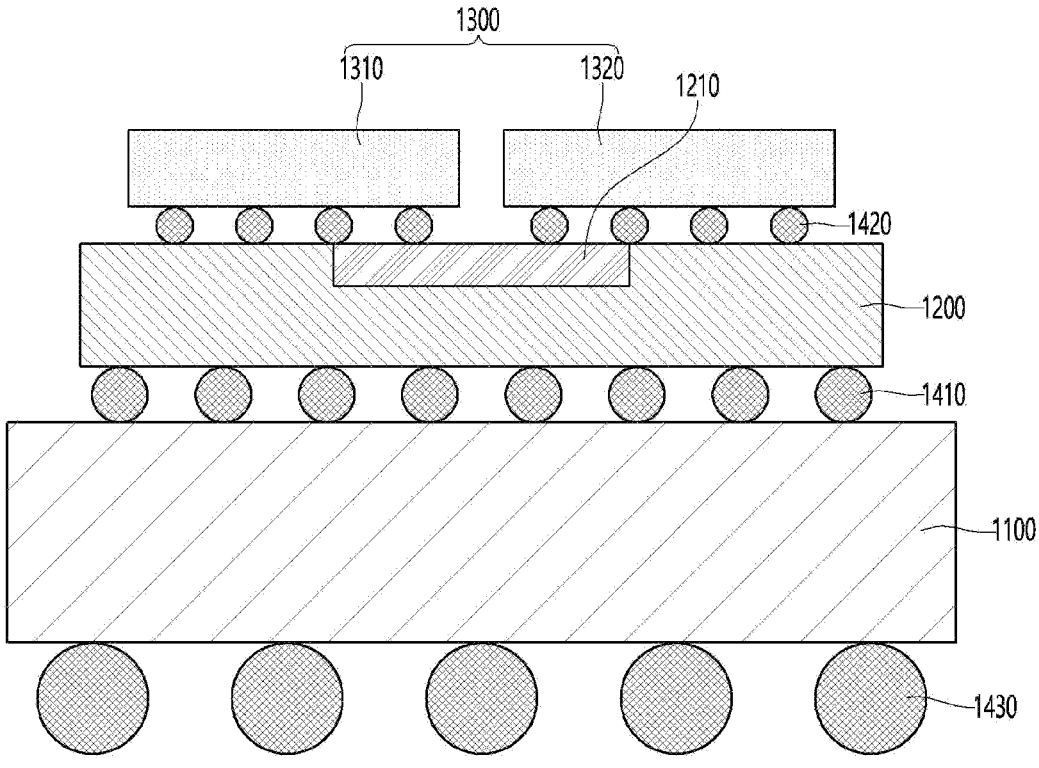
【FIG. 2c】
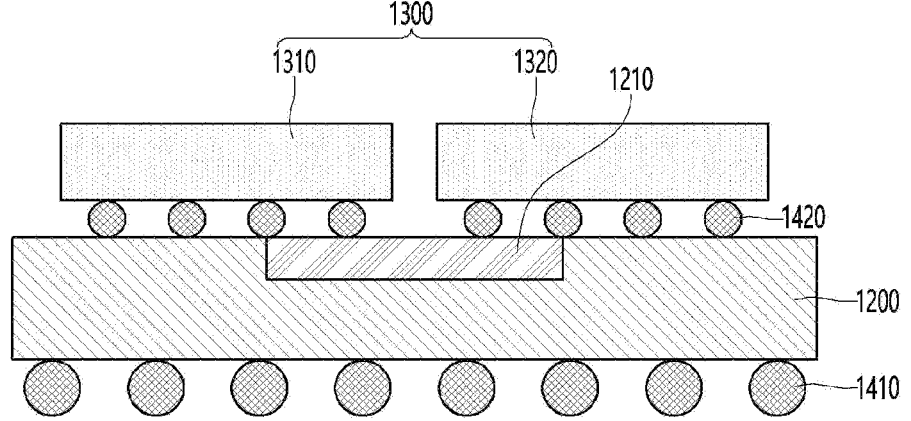

【FIG. 2d】
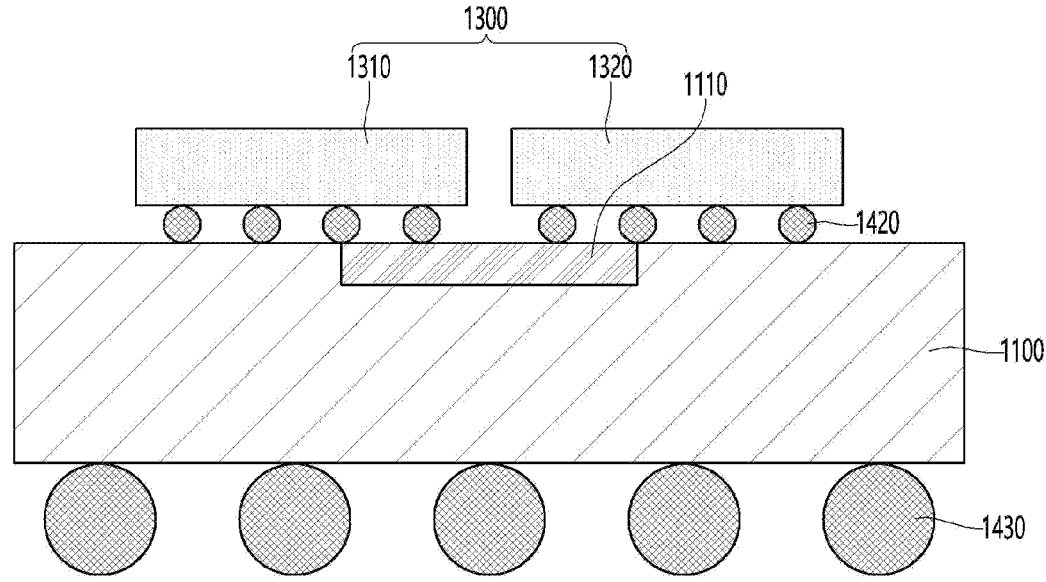
【FIG. 2e】
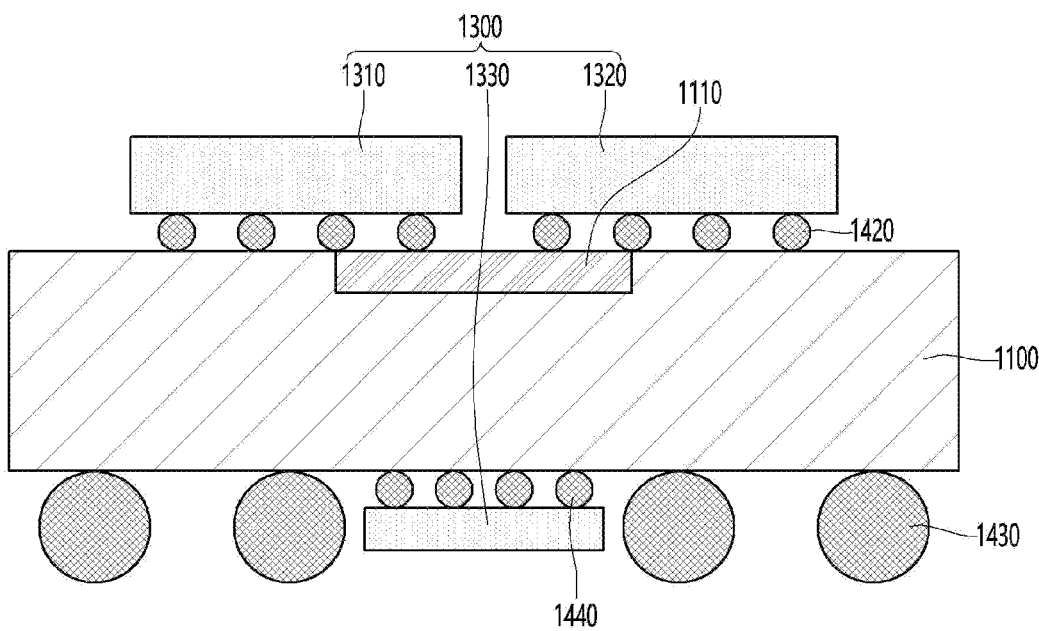

【FIG. 2f】
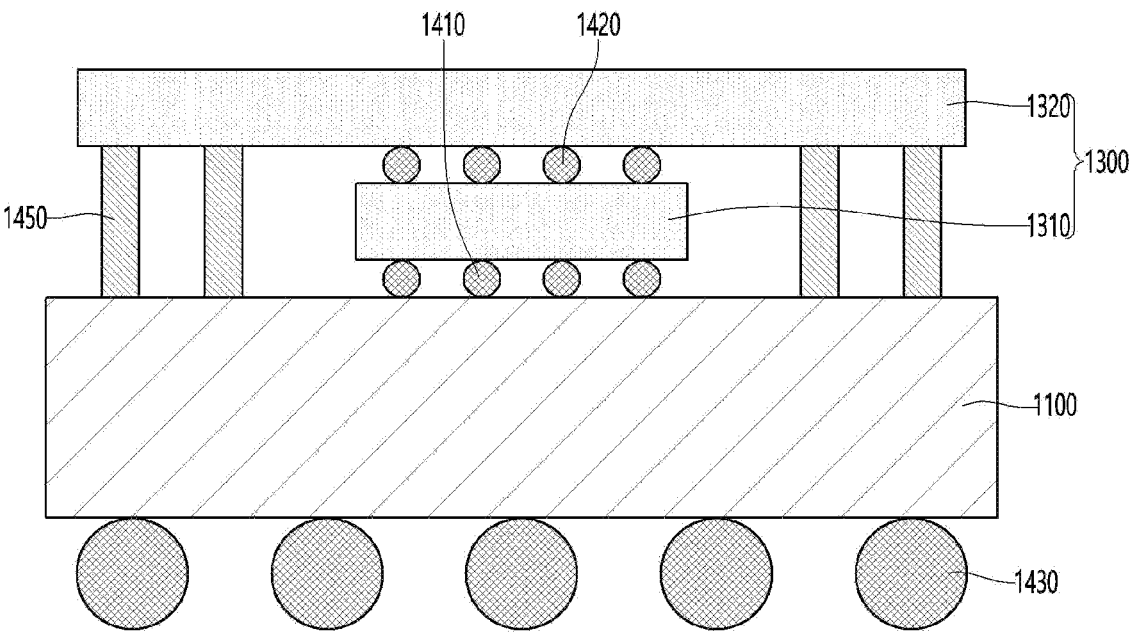
【FIG. 2g】
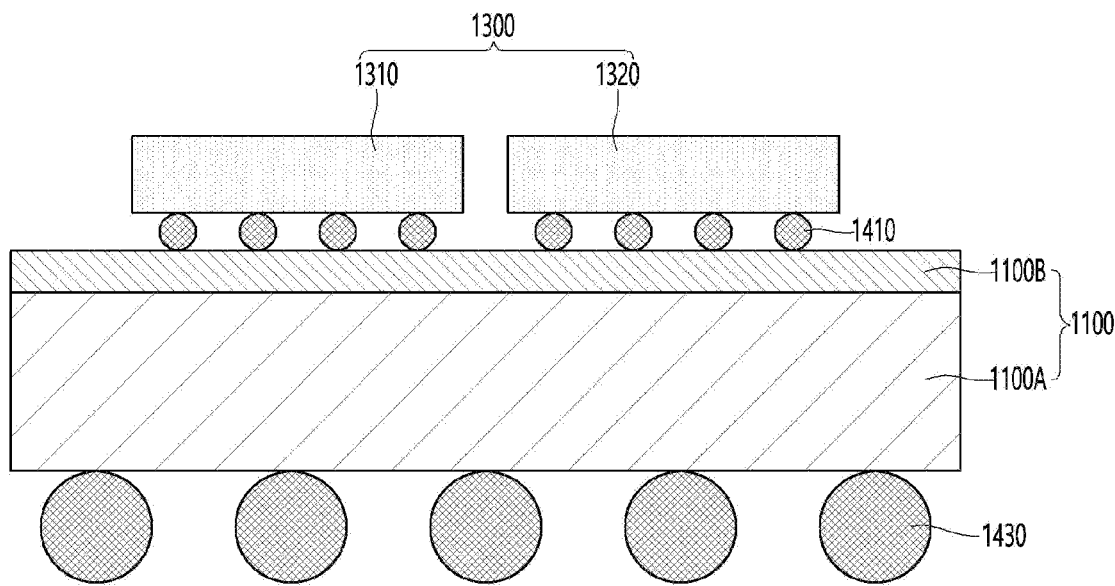

【FIG. 3a】
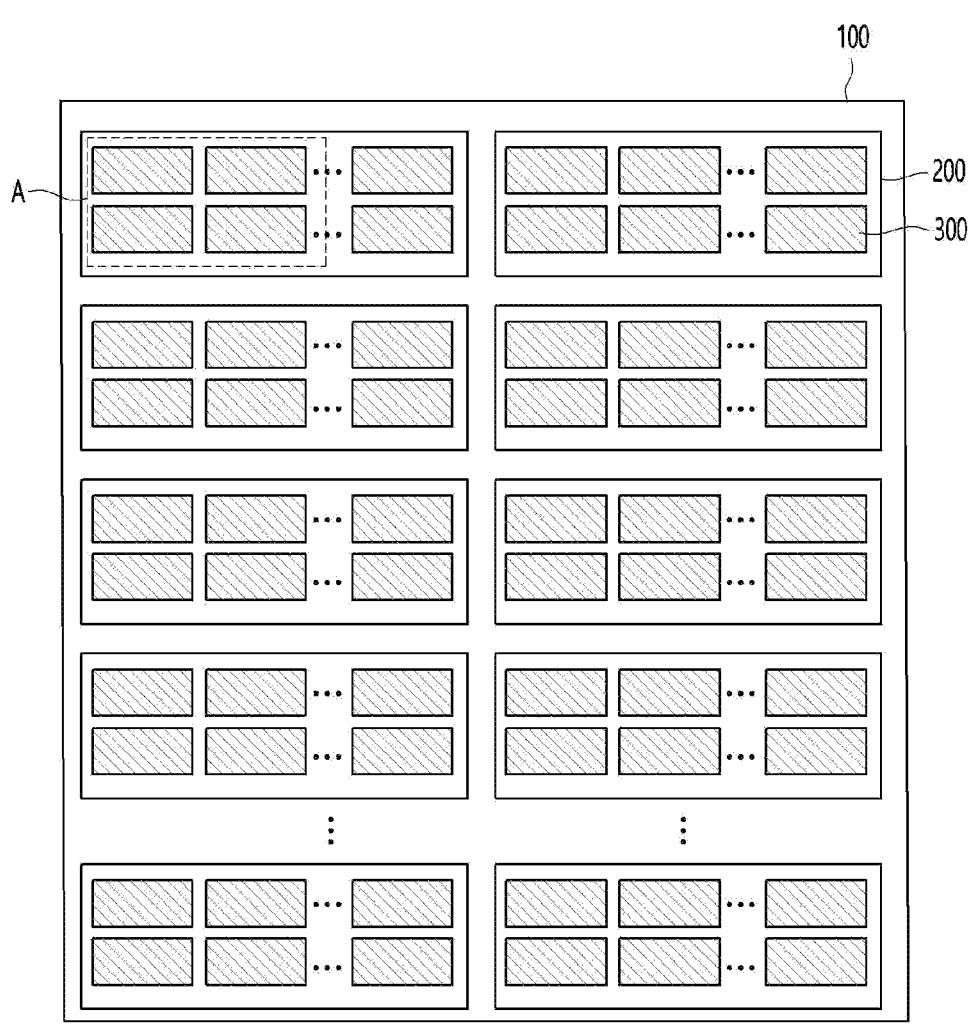

【FIG. 3b】
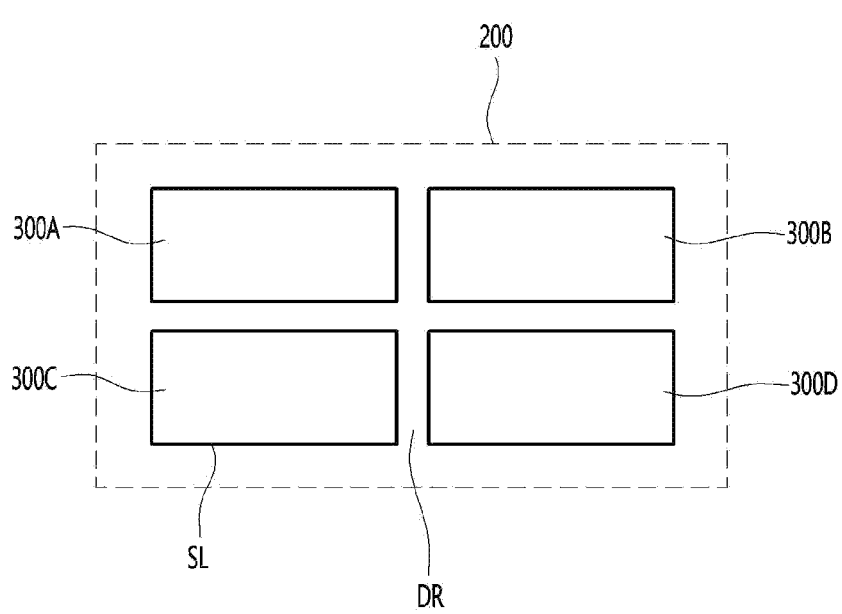

【FIG. 4a】
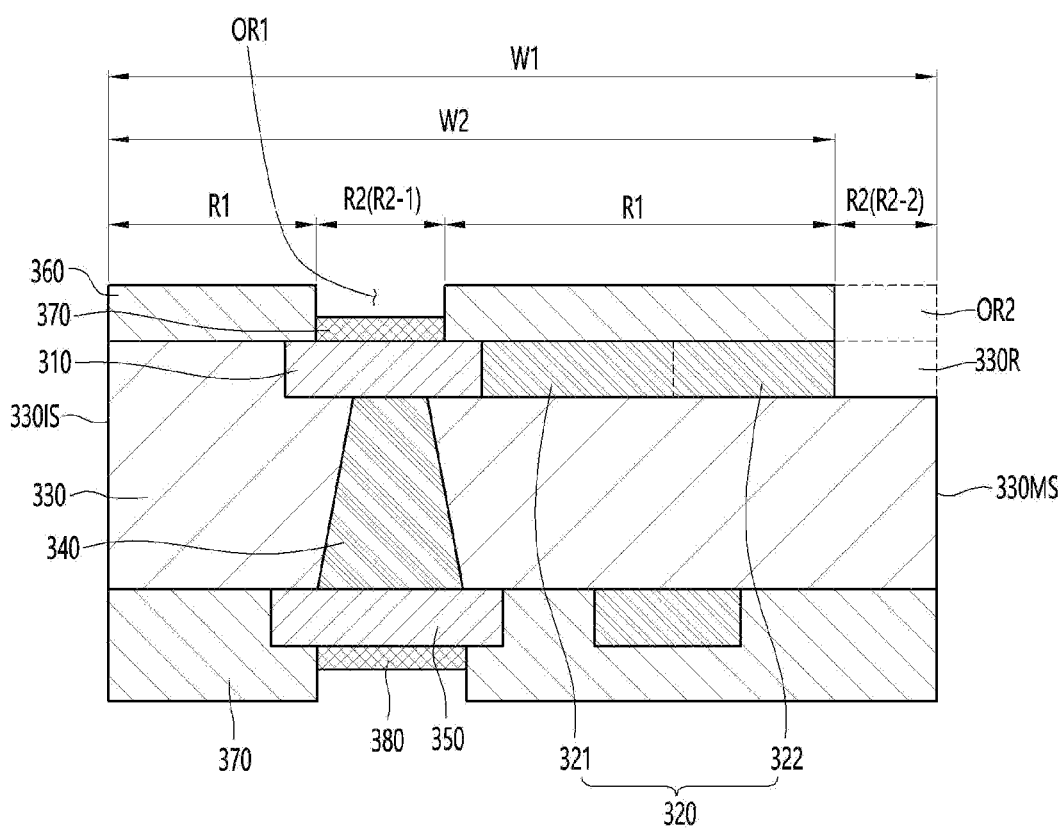

【FIG. 4b】
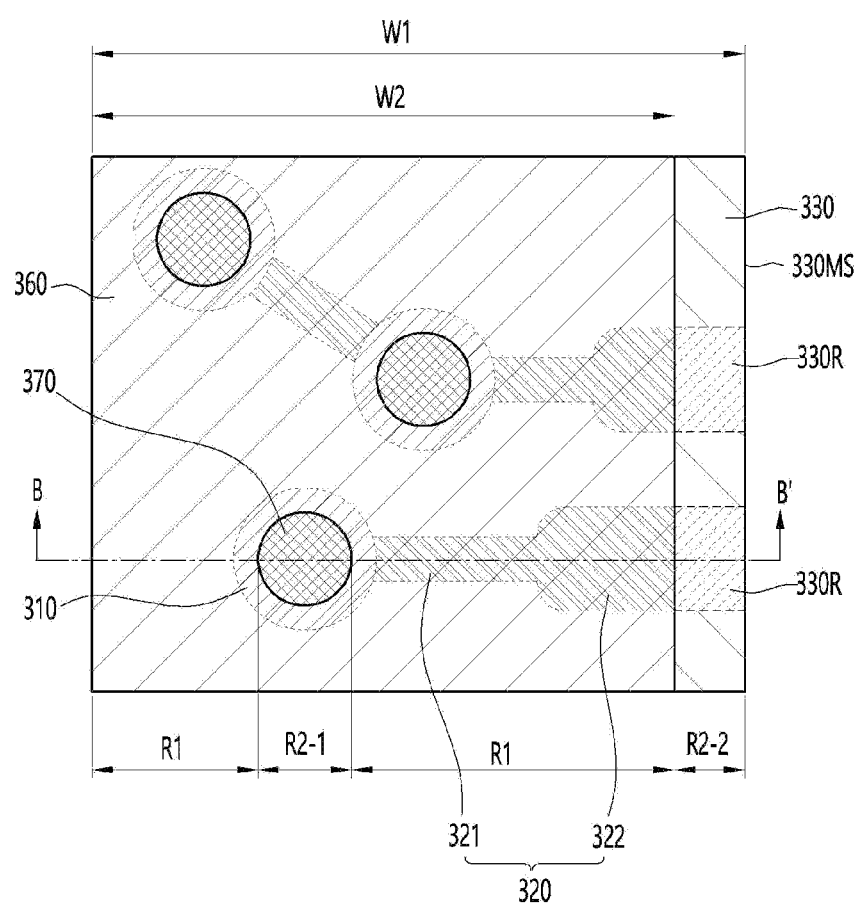

【FIG. 4c】
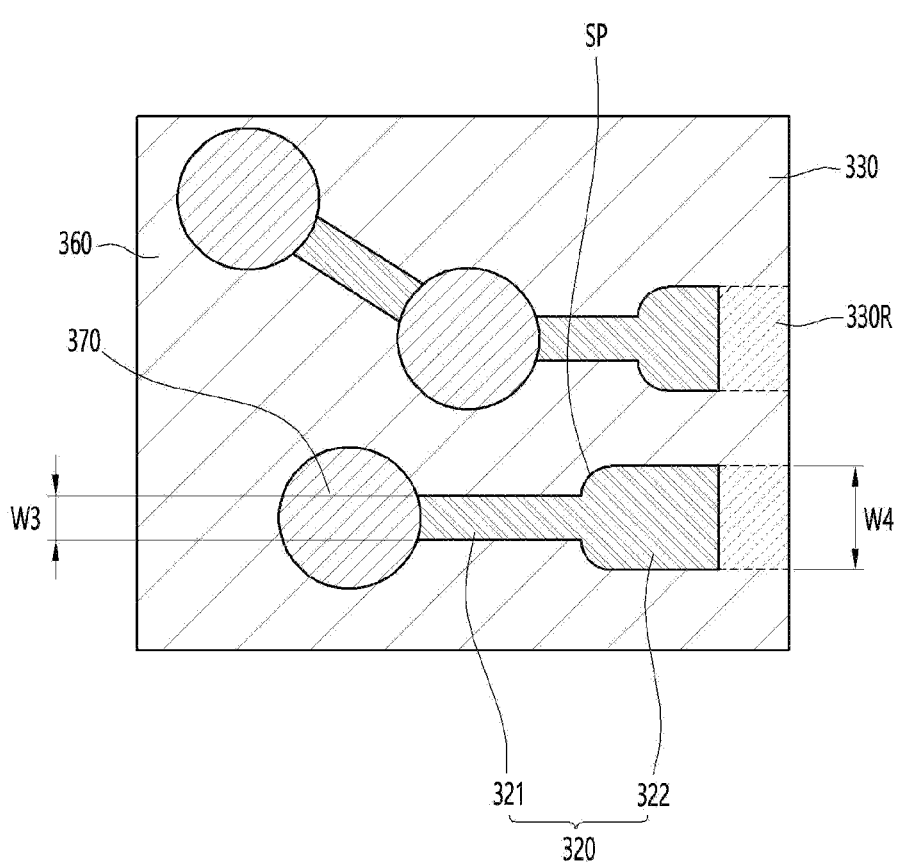

【FIG. 5a】
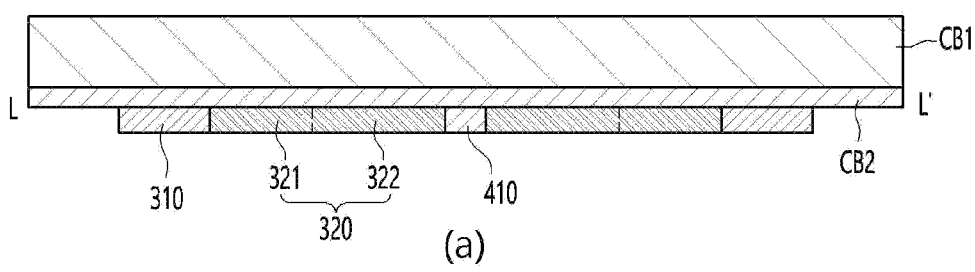
(a)
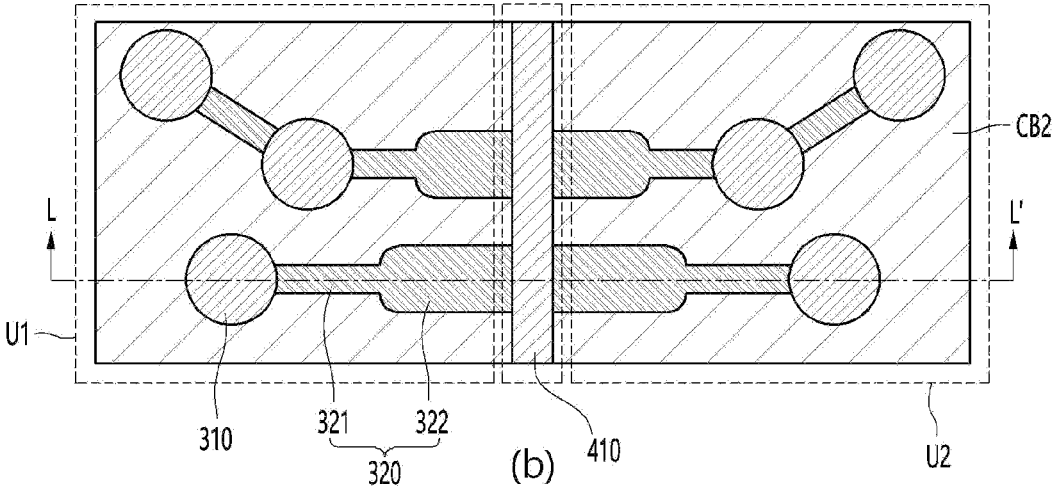
(b)

【FIG. 5b】
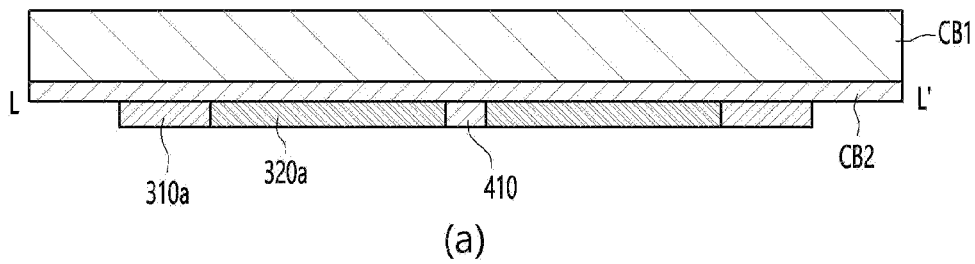
(a)
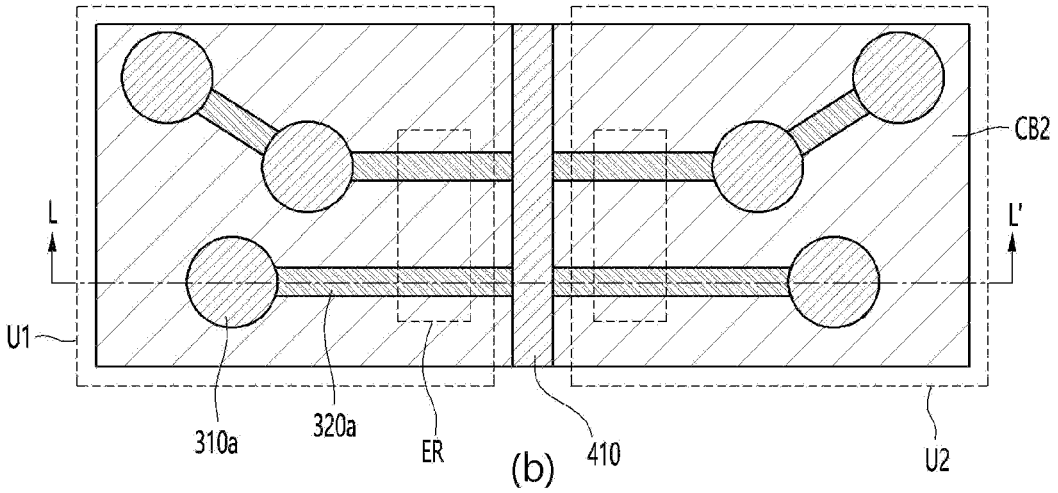
(b)
【FIG. 5c】
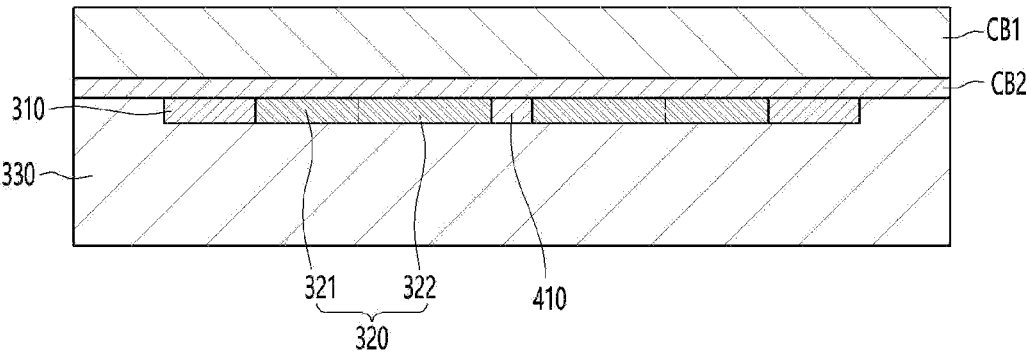

【FIG. 5d】
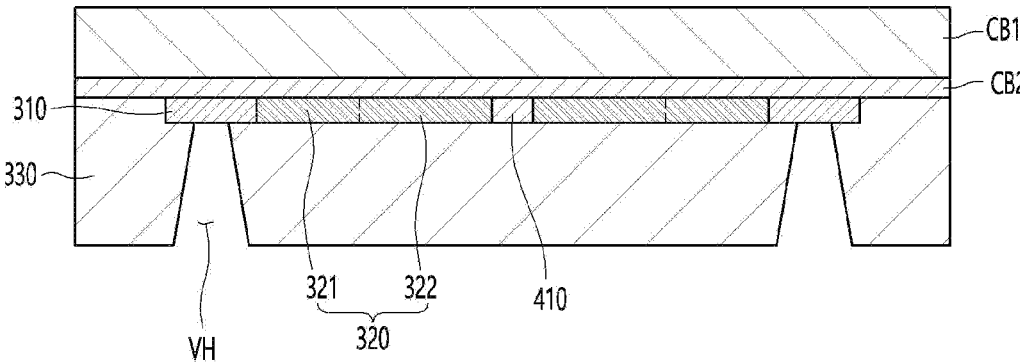
【FIG. 5e】
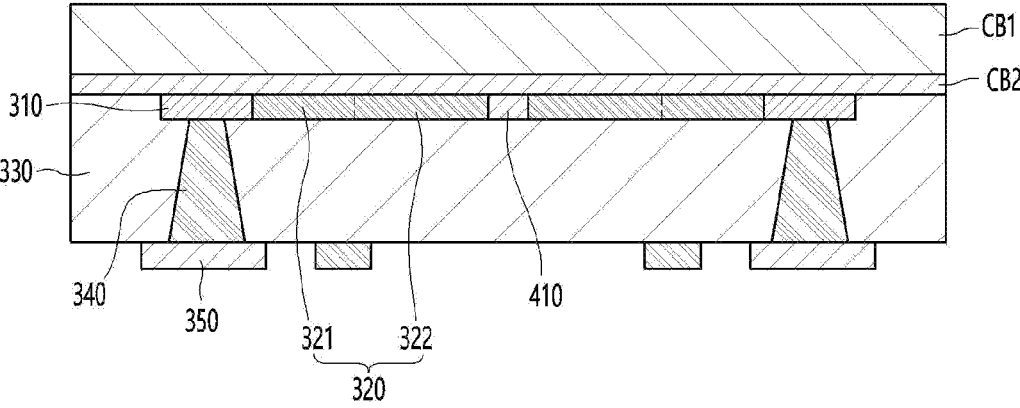
【FIG. 5f】
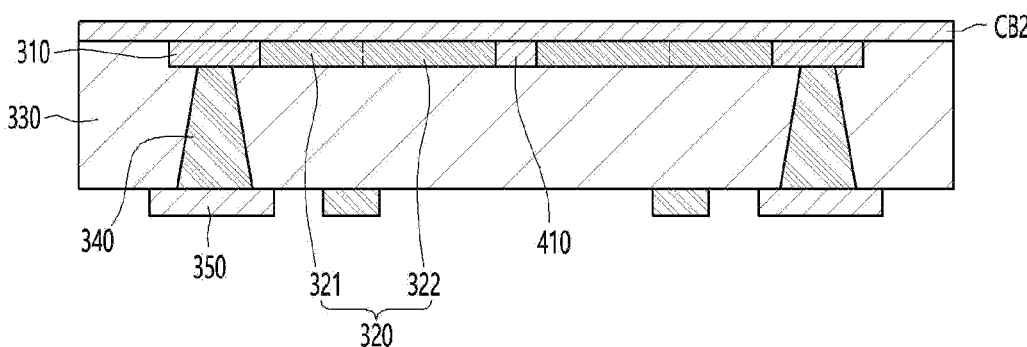

【FIG. 5g】
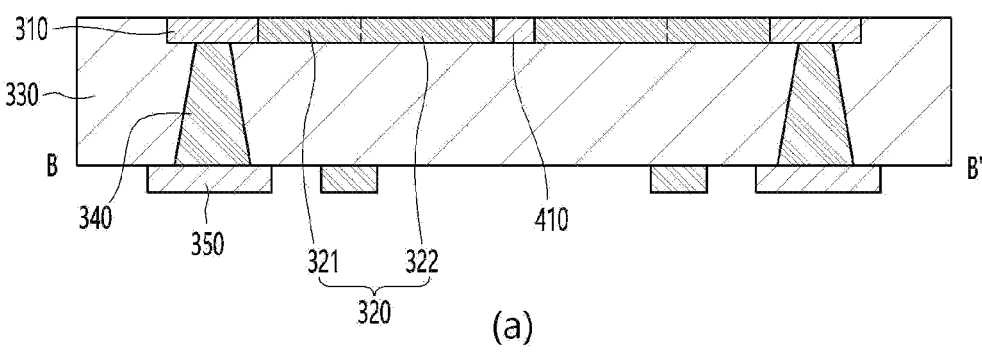
(a)
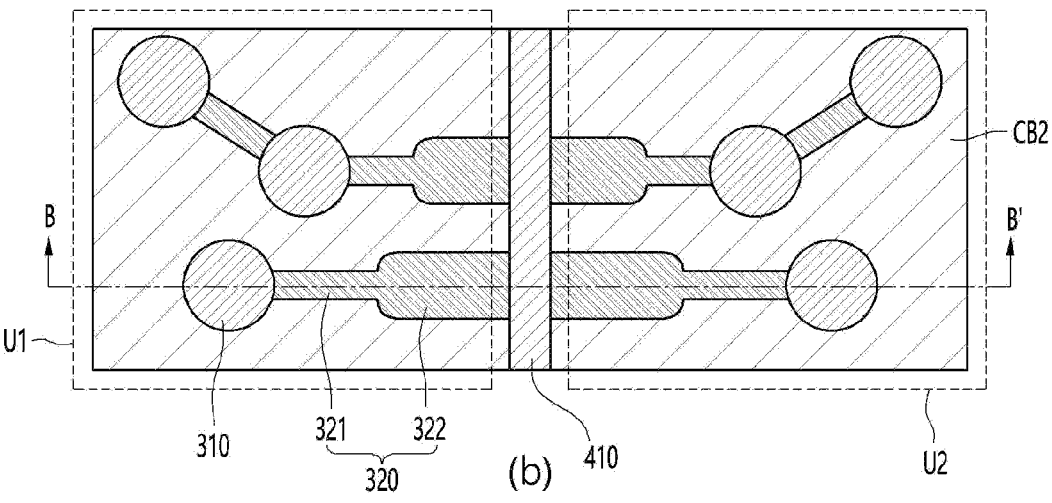
(b)

【FIG. 5h】
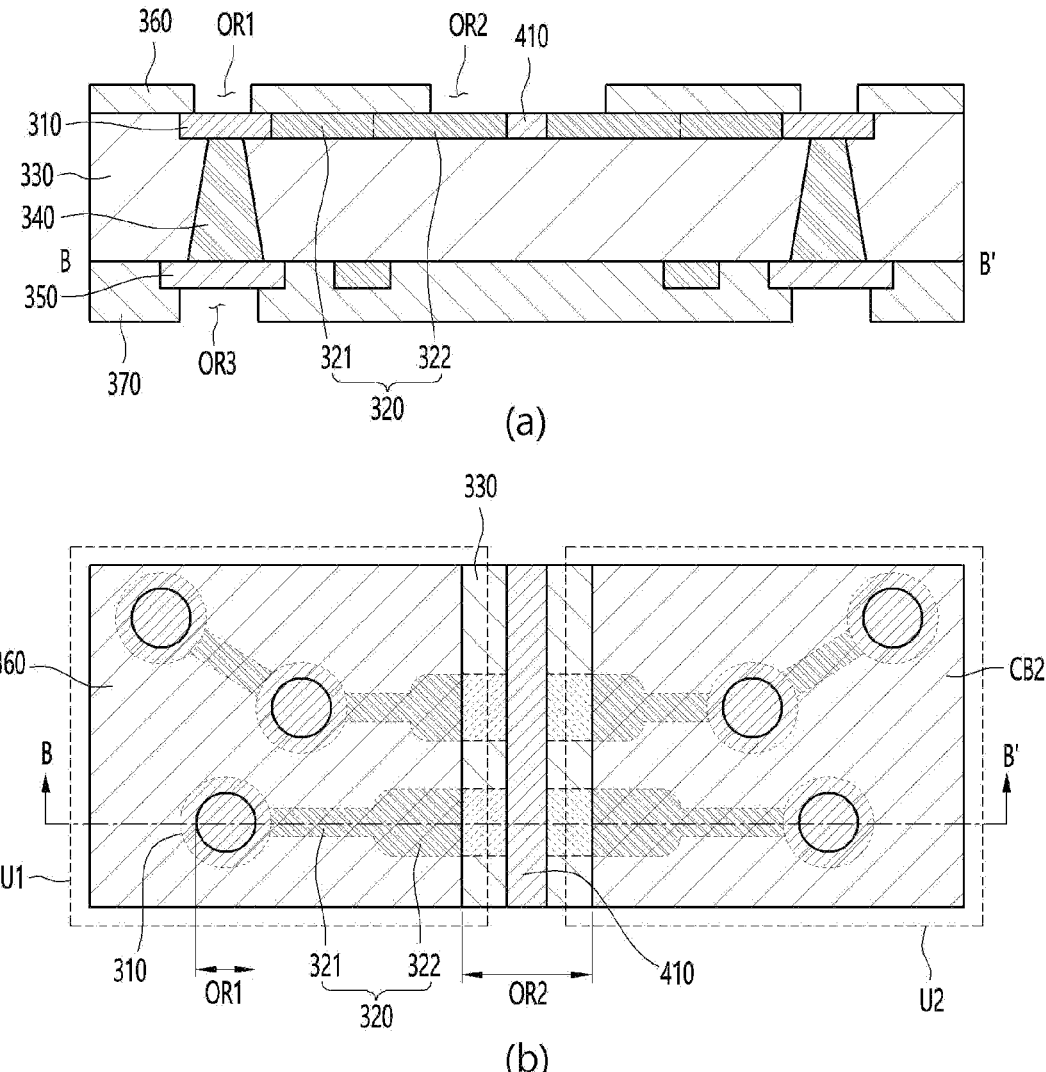
(a)
(b)

【FIG. 5i】
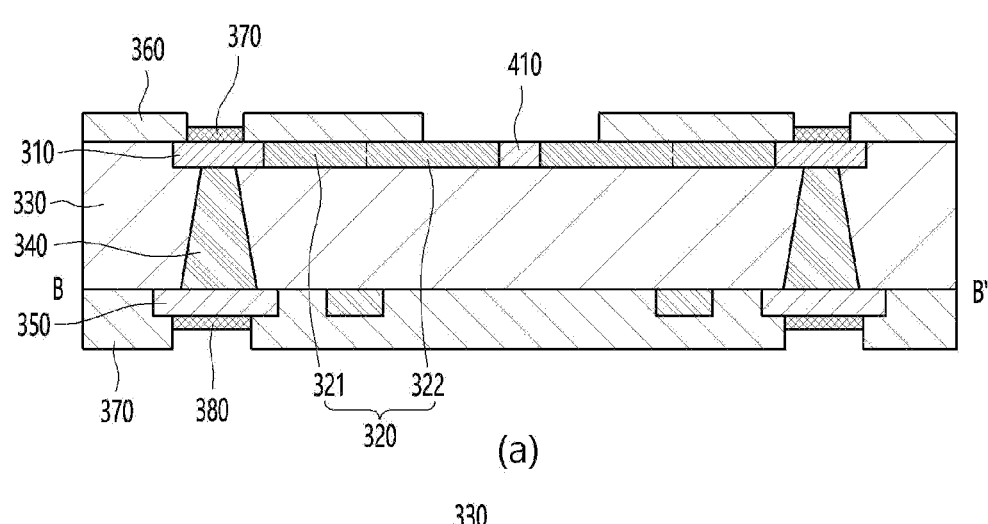
(a)
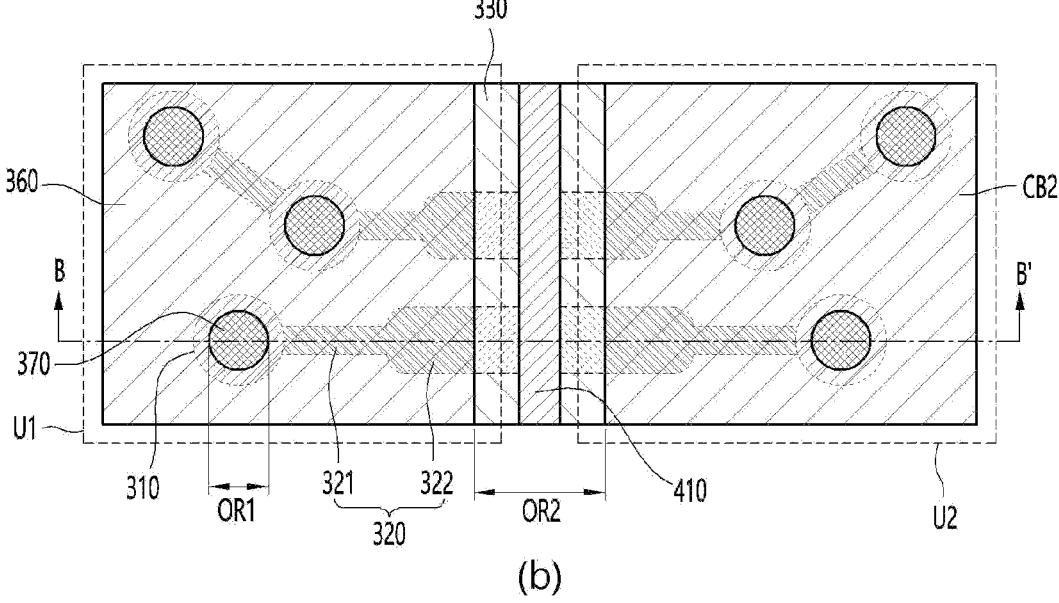
(b)

【FIG. 5j】
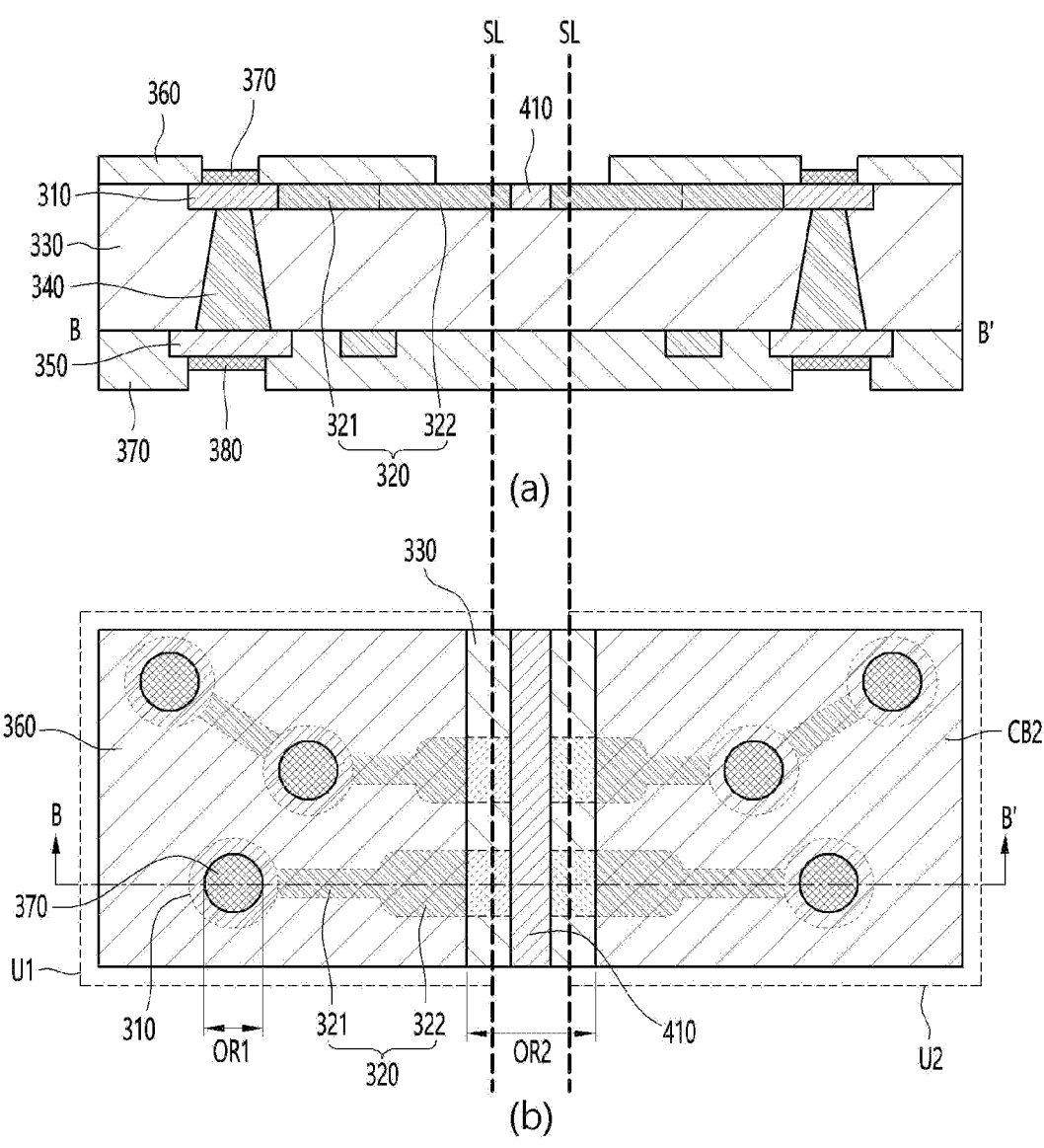
(a)
(b)

【FIG. 5k】
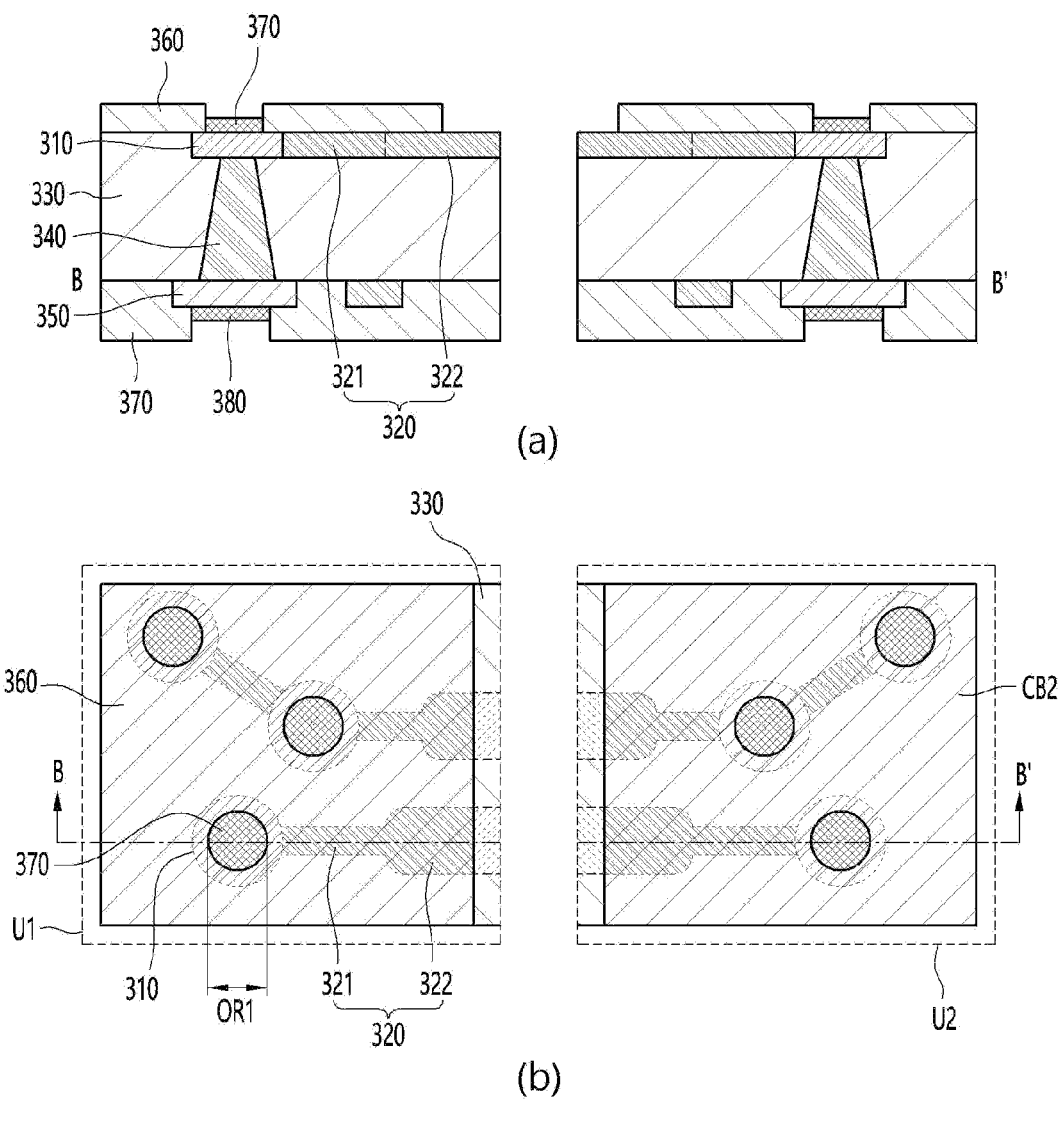
(a)
(b)

【FIG. 5I】
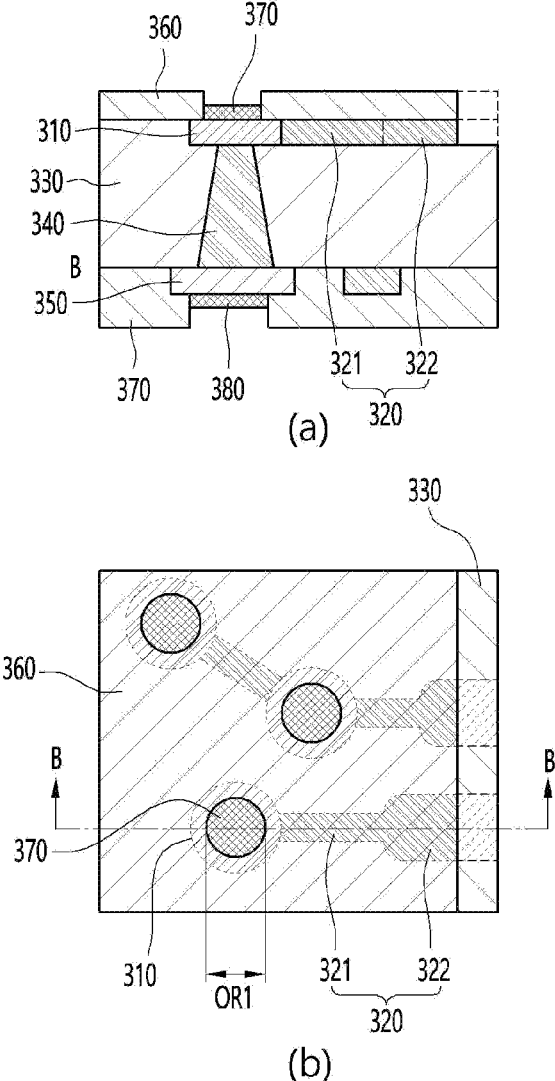
(a)
(b)

【FIG. 6a】
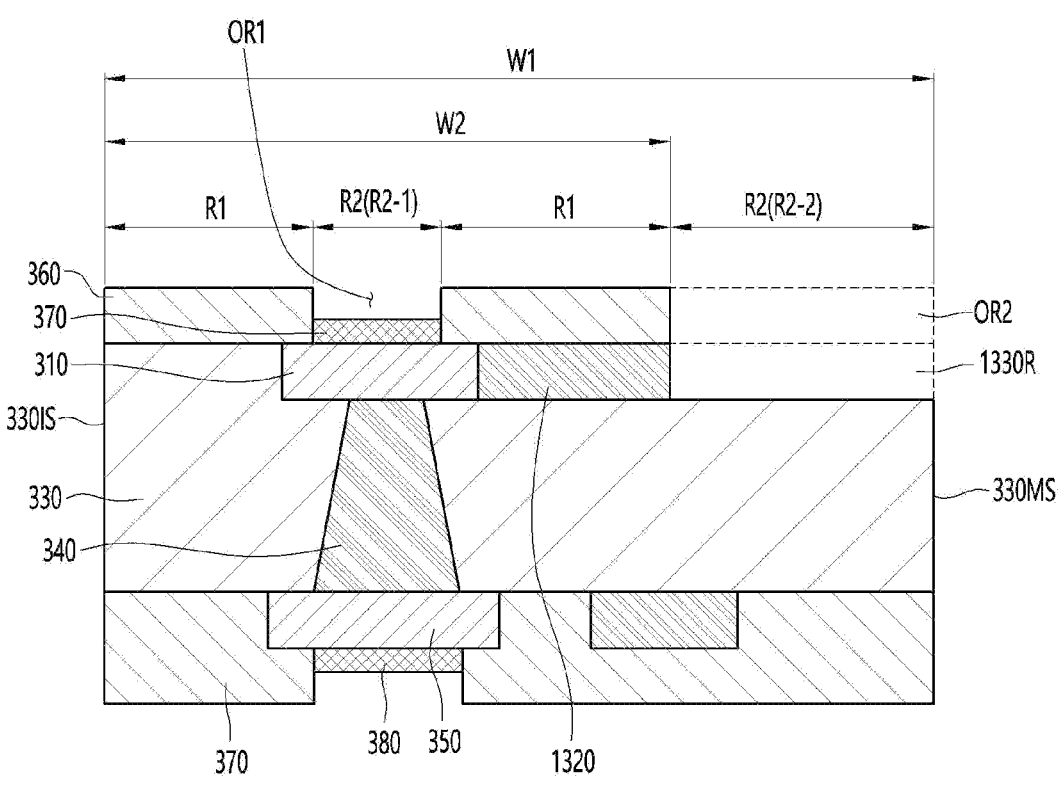

【FIG. 6b】
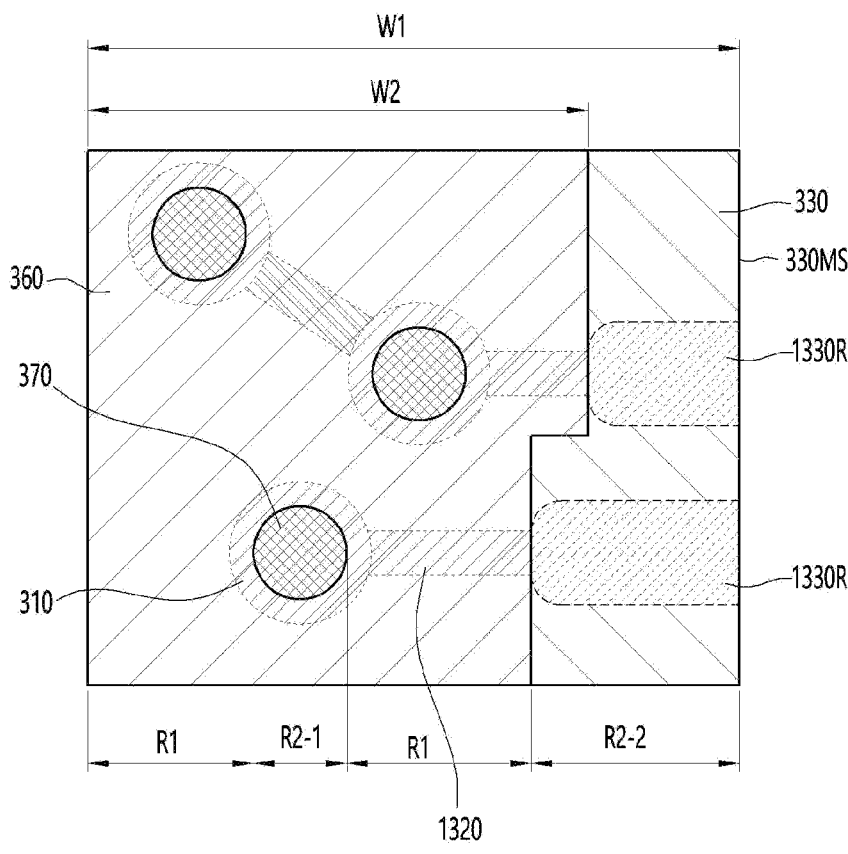

【FIG. 7a】
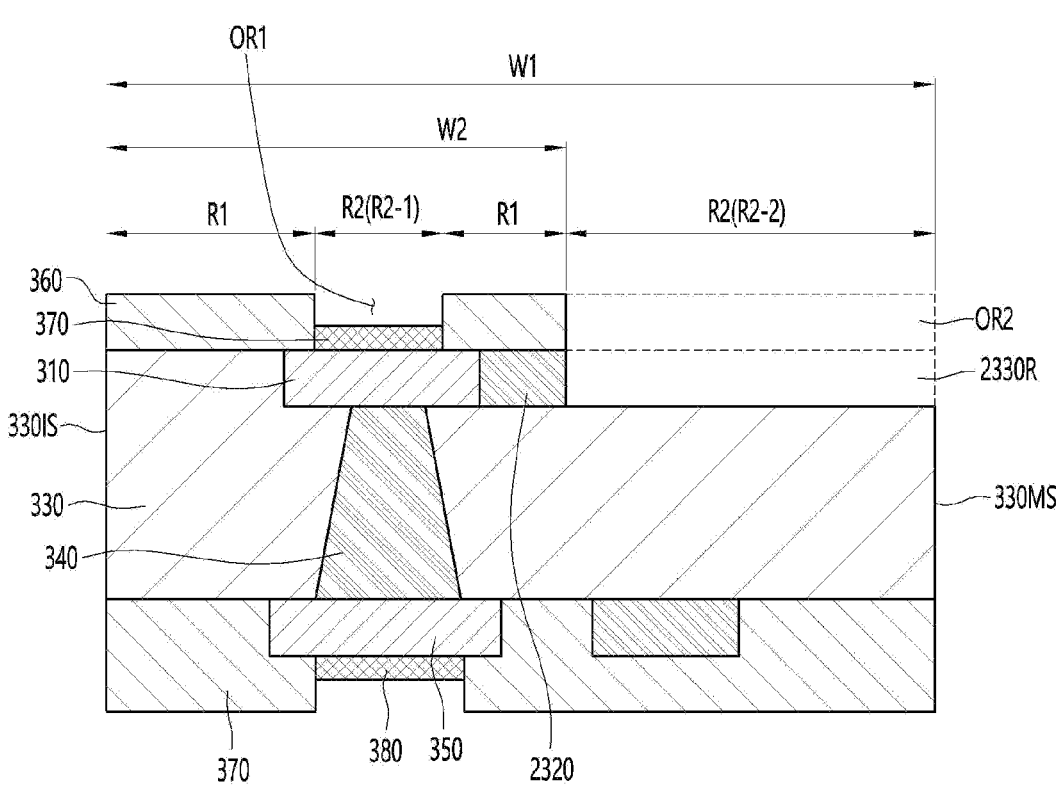

【FIG. 7b】
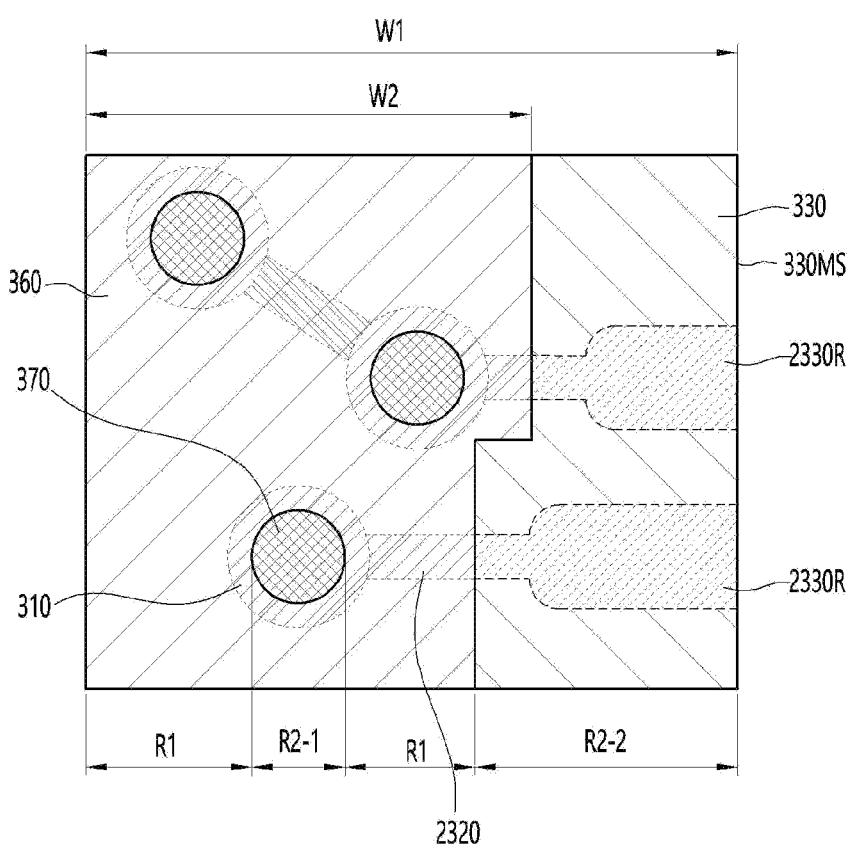

CIRCUIT BOARD AND SEMICONDUCTOR PACKAGE COMPRISING SAME

CROSS REFERENCE TO RELATED APPLICATIONS

This application is the National Phase of PCT International Application No. PCT/KR2022/011241, filed on Jul. 29, 2022, which claims priority under 35 U.S.C. 119 (a) to Patent Application No. 10-2021-0100986, filed in the Republic of Korea on Jul. 30, 2021, all of which are hereby expressly incorporated by reference into the present application.

TECHNICAL FIELD

An embodiment relates to a circuit board and a semiconductor package comprising the same.

BACKGROUND ART

As miniaturization, weight reduction, and integration of an electronic component are accelerated, a line width of a circuit has been miniaturized. In particular, as a design rule of a semiconductor chip is integrated on a nanometer scale, a circuit line width of a package substrate or a printed circuit board on which the semiconductor chip is mounted has been miniaturized to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for miniaturizing the circuit pitch.

A circuit board manufactured by the conventional ETS method includes an insulating layer and a circuit pattern buried in the insulating layer. A manufacturing process of the circuit board includes a process of forming the circuit pattern on a carrier member, and a process of laminating an insulating layer covering the circuit pattern on the carrier member.

In this case, circuit patterns are densely formed in a central region of an upper surface of the insulating layer. However, the density of the circuit pattern in an outer region of the upper surface of the insulating layer (eg, the region adjacent to a plating lead) is lower than that of the central region.

Accordingly, when the process of laminating the insulating layer is performed, a void in which the region between the circuit patterns is not completely filled with the insulating layer is generated in a low-density region.

In addition, the overall thickness of recent circuit boards is becoming thinner, and accordingly, the thickness of the insulating layer is also getting thinner. In addition, as the thickness of the insulating layer decreases, a region in which the void occurs is further increased. At this time, if the void occurs, the strength of the insulating layer is reduced due to the void, and accordingly, there is a problem in that the insulating layer is easily cracked. Furthermore, the void causes the substrate to warp in the case of manufacturing a multilayer substrate by the ETS method, and accordingly, there is a problem in that defects due to the warpage occur in the manufacturing process of the multilayer substrate (For example, a defect in which the position of the through hole or through electrode is misaligned due to bending, or a defect in which the through electrode and the pad are not vertically aligned).

Accordingly, there is a demand for a circuit board or a method of manufacturing a circuit board having a new structure capable of solving the problem of voids in which the insulating layer is not filled in the process of manufacturing the circuit board by the ETS method.

DISCLOSURE

Technical Problem

The embodiment provides a circuit board having a novel structure and a semiconductor package including the same.

In addition, the embodiment provides a circuit board having a structure in which empty spaces (eg, voids) not filled with an insulating layer in a circuit board manufactured by an ETS method are minimized and a semiconductor package including the same.

In addition, the embodiment provides a circuit board having a structure in which warpage is minimized and a semiconductor package including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes a first insulating layer; a first circuit pattern disposed on the first insulating layer; and a second insulating layer disposed on the first insulating layer and having a width narrower than that of the first insulating layer; wherein an upper surface of the first insulating layer includes a first region vertically overlapping with the second insulating layer, and a second region excluding the first region, wherein the first circuit pattern includes an extension portion extending from the first region to the second region; and wherein a width of the extension portion in the second region is greater than a width of at least a part of the extension portion in the first region.

In addition, the extension portion includes a step portion having a width varying in a portion adjacent to the second region.

In addition, the first circuit pattern includes a pad portion disposed in the first region, wherein the extension portion includes: a first portion positioned adjacent to the pad portion; and a second portion disposed closer to the second region than the first portion; and wherein a width of the first portion is different from a width of the second portion.

In addition, the width of the second portion of the extension portion is wider than the width of the first portion of the extension portion.

In addition, the second region includes an edge region of the upper surface of the first insulating layer adjacent to an outermost end of the first insulating layer.

In addition, the second insulating layer includes: a first opening vertically overlapping with at least a part of an upper surface of the pad portion; and a second opening vertically overlapping with the second region of the first insulating layer; wherein the extension portion extends from the pad portion toward the second opening.

In addition, the circuit board further includes a first surface treatment layer disposed on the upper surface of the pad portion vertically overlapping with the first opening.

In addition, the second region of the upper surface of the first insulating layer is provided with a recess concave toward a lower surface of the first insulating layer.

In addition, the recess is connected to one end of the second portion of the extension portion and an outermost end of the first insulating layer.

In addition, a width of the recess is equal to the width of the second portion of the extension portion.

In addition, a lower surface of the recess is positioned on the same plane as a lower surface of the extension portion.

On the other hand, the circuit board according to another embodiment includes a first insulating layer; and a first circuit pattern disposed on the first insulating layer; wherein the first circuit pattern includes: a pad portion; and an extension portion extending from the pad portion toward an outermost end of the first insulating layer; wherein the extension portion includes a step portion having a width varying in a portion adjacent to the outermost end portion.

In addition, the circuit board further includes a second insulating layer disposed on the first insulating layer; wherein the extension portion includes: a first portion positioned adjacent to the pad portion and vertically overlapping the second insulating layer; and a second portion disposed between the first portion and the outermost end of the first insulation layer and vertically overlapping the second insulation layer; and wherein a width of the second portion is greater than a width of the first portion.

In addition, the circuit board further includes a second insulating layer disposed on the first insulating layer; wherein an upper surface of the first insulating layer includes: a first region vertically overlapping with the second insulating layer, and a second region excluding the first region, wherein the extension portion includes: a first portion positioned adjacent to the pad portion; and a second portion disposed closer to the second region than the first portion; wherein a width of the second portion is greater than a width of the first portion.

In addition, the second insulating layer includes an opening vertically overlapping with the second region of the first insulating layer; wherein a recess provided in the second region of the upper surface of the first insulating layer; and wherein the recess vertically overlaps with the opening of the second insulating layer and is concave toward a lower surface of the first insulating layer.

On the other hand, the circuit board according to another embodiment includes a first insulating layer; a first circuit pattern disposed on the first insulating layer; and a second insulating layer disposed on the first insulating layer; wherein an upper surface of the first insulating layer includes: a first region vertically overlapping with the second insulating layer, and a second region excluding the first region, wherein at least one of the first circuit patterns, a pad portion; and an extension portion extending from the pad portion toward the second region; wherein a recess is provided in the second region of the upper surface of the first insulating layer, and wherein the recess is concave toward a lower surface of the first insulating layer, has a different width than the extension portion, and is connected to the extension portion.

In addition, the recess has a width wider than a width of the extension portion, and is connected to an outermost end of the first insulating layer.

On the other hand, the circuit board according to another embodiment includes a first insulating layer; a first circuit pattern disposed on the first insulating layer; and a second insulating layer disposed on the first insulating layer; wherein an upper surface of the first insulating layer includes: a first region vertically overlapping with the second insulating layer, and a second region excluding the first region, wherein at least one of the first circuit patterns includes: a pad portion; and an extension portion extending from the pad portion toward the second region; wherein the second region of the upper surface of the first insulating layer includes a recess concave toward a lower surface of the first insulating layer and including a step portion having a width varying in a portion adjacent to the second region.

In addition, the recess includes: a first recess adjacent the extension portion; and a second recess adjacent to an outermost end of the first insulating layer; wherein a width of the first recess is different from a width of the second recess.

In addition, the width of the first recess is equal to a width of the extension portion; and wherein the width of the second recess is greater than a width of the extension portion and a width of the first recess.

Advantageous Effects

The circuit board of the embodiment includes an insulating layer, a first circuit pattern disposed on the insulating layer, and a protective layer disposed on the insulating layer and having a width narrower than that of the insulating layer, wherein an upper surface of the insulating layer includes a first region overlapping the protective layer and a second region excluding the first region, wherein at least one of the first circuit pattern includes a pad portion, and an extension portion extending from the pad portion toward the second region, and wherein the extension portion includes a step portion having a width varying in a portion adjacent to the second region. Here, the step portion is characterized in that the width increases in a region adjacent to the second region of the upper surface of the insulating layer. That is, the extension portion includes a first portion adjacent to the pad portion and a second portion adjacent to the second region of the upper surface of the insulating layer, and a width of the second portion is greater than a width of the first portion. The embodiment can solve the void problem caused by the low density of the circuit pattern in the second region of the upper surface of the insulating layer when manufacturing the circuit board by the ETS method, and accordingly, the physical reliability of the circuit board may be improved.

Furthermore, the protective layer disposed on the upper surface of the insulating layer in the embodiment includes a second opening vertically overlapping with the second region of the insulating layer. In this case, the second opening may vertically overlap the protective layer disposed on a lower surface of the insulating layer. Preferably, the width of the protective layer on the upper surface of the insulating layer may be greater than a width of the protective layer on the lower surface of the insulating layer. Accordingly, the embodiment may minimize warpages occurring in a circuit board having an ETS structure having an asymmetric structure, and thus may improve physical reliability and electrical reliability of the circuit board.

DESCRIPTION OF DRAWINGS

FIG. 1A is a view for explaining a method of manufacturing a circuit board according to a comparative example.

FIG. 1B is a view for explaining a problem in a method of manufacturing a circuit board of a comparative example.

FIG. 2A is a cross-sectional view illustrating a semiconductor package according to a first embodiment.

FIG. 2B is a cross-sectional view illustrating a semiconductor package according to a second embodiment.

FIG. 2C is a cross-sectional view illustrating a semiconductor package according to a third embodiment.

FIG. 2D is a cross-sectional view illustrating a semiconductor package according to a fourth embodiment.

FIG. 2E is a cross-sectional view illustrating a semiconductor package according to a fifth embodiment.

FIG. 2F is a cross-sectional view illustrating a semiconductor package according to a sixth embodiment.

FIG. 2G is a cross-sectional view illustrating a semiconductor package according to a seventh embodiment.

FIG. 3A is a view illustrating a panel for manufacturing a circuit board according to an embodiment.

FIG. 3B is a view for explaining a manufacturing process of a circuit board in the panel unit of FIG. 3A.

FIG. 4A is a cross-sectional view of the circuit board according to a first embodiment.

FIGS. 4B and 4C are plan views of the circuit board of the first embodiment as viewed from above.

FIGS. 5A to 5L are views for explaining the manufacturing method of the circuit board according to the first embodiment in a process order.

FIG. 6A is a cross-sectional view of a circuit board according to a second embodiment.

FIG. 6B is a plan view of the circuit board of the second embodiment as viewed from above.

FIG. 7A is a cross-sectional view of a circuit board according to a third embodiment.

FIG. 7B is a plan view of the circuit board according to the third embodiment as viewed from above.

BEST MODE

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

As used herein, the singular forms "a," "an" and "the" are intended to include the plural forms as well, unless the context clearly indicates otherwise.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Hereinafter, an embodiment of the present invention will be described in detail with reference to the accompanying drawings.

FIG. 1A is a view for explaining a method of manufacturing a circuit board according to a comparative example, and FIG. 1B is a view for explaining a problem in a method of manufacturing a circuit board of a comparative example.

Referring to FIGS. 1A and 1B, a circuit board of the comparative example is manufactured by an Embedded Trace Substrate (ETS) method for miniaturization of a circuit pattern.

In addition, a circuit pattern in the ETS method is formed by electroplating using a seed layer instead of forming a circuit pattern by etching a copper foil layer. For this reason, there is no change in the shape of the circuit pattern due to etching, and accordingly, the circuit pattern can be miniaturized.

In the comparative example, the ETS method is performed by performing a plating process on a carrier board or a support member to form a fine circuit pattern.

To this end, in the comparative example, as in (a) of FIG. 1A, a carrier board or a support member is prepared. CCL (Copper Clad Laminate) is generally used for the carrier board or the support member.

For example, the carrier board or the support member includes a carrier insulating layer 10 and a carrier copper foil layer 20 disposed on the carrier insulating layer 10.

In addition, the carrier insulating layer 10 and the carrier copper foil layer 20 may be implemented using CCL.

And, the comparative example proceeds to form a circuit pattern by applying the dry film 40 directly on the carrier copper foil layer 20. Alternatively, the comparative example proceeds to form a circuit pattern by using an additional plating layer after forming the additional plating layer (not shown) on the carrier copper foil layer 20. Hereinafter, it will be described that the process of forming the circuit pattern is performed directly on the carrier copper foil layer 20.

Next, in the comparative example, a dry film (not shown) may be formed on the carrier copper foil layer 20, and a process of forming the circuit pattern 30 may be performed using the formed dry film. For example, in the comparative example, after coating a dry film on the carrier copper foil layer 20, an opening (not shown) may be formed in the applied dry film. In this case, the opening of the dry film may vertically overlap a region in which a circuit pattern is to be formed among the upper surface of the carrier copper foil layer 20.

Next, as shown in (b) of FIG. 1, the comparative example proceeds with a process of forming a circuit pattern 30 on the carrier copper foil layer 20 by electroplating the carrier copper foil layer 20 as a seed layer.

Next, as shown in (c) of FIG. 1, the comparative example proceeds with a process of forming an insulating layer 40 covering the circuit pattern 30 on the carrier copper foil layer 20.

In this case, the upper surface of the carrier copper foil layer 20 may include a region in which the circuit patterns 30 are dense and a region other than the region. For example, the density of the circuit pattern 30 may be different for each region of the upper surface of the carrier copper foil layer 20. For example, the density of the circuit pattern 30 in the outer region (or edge region) of the upper surface of the carrier copper foil layer 20 is lower than the density of the circuit pattern 30 in the central region of the upper surface of the carrier copper foil layer 20.

Here, the insulating layer 40 includes a first portion disposed between the circuit patterns on the carrier copper foil layer 20 and a second portion disposed on the first portion to have a predetermined height than the circuit pattern. In addition, since the first portion in the outer region has a lower density of the circuit patterns compared to the first portion in the central region, the interval between the circuit patterns is wide. Accordingly, as shown in (a) of FIG. 1B, there is a problem in that the void 50, which is an empty space in which the insulating layer 40 is not completely filled, exists in the first portion of the outer region. In addition, the void 50 acts as a factor to reduce the strength of the circuit board, which may cause a problem in physical reliability.

Furthermore, even if the void 50 does not exist, due to the difference in density of the circuit pattern of the first portion in the central region and the first portion in the outer region, there is a problem in that the upper surface of the insulating layer 40 after the insulating layer 40 is laminated has a curved 45 rather than a flat surface. In addition, the curved 45 may cause a reliability problem during a lamination process for manufacturing a multilayer substrate. For example, a curvature of the circuit board may occur due to the curved 45, which may cause a misalignment of the position of the through hole penetrating the insulating layer or a problem in alignment in the vertical direction between the through electrode and the circuit pattern. On the other hand, the circuit board as described above is manufactured in a panel unit (composed of a plurality of circuit boards), and accordingly, when the above defect occurs, there is a problem in that all circuit boards included in one panel are defective.

Furthermore, in recent years, as the circuit board is slimmed down, the insulating layer 40 is also getting thinner. Also, the degree of occurrence of the void 50 and the curved 45 become more severe as the insulating layer 40 becomes thinner.

Accordingly, the embodiment solves the problem of voids or surface curvature of the insulating layer due to the difference in density of the circuit pattern, thereby improving the physical reliability of the circuit board.

—Electronic Device—

Before describing the embodiment, an electronic device to which the semiconductor package of the embodiment is applied will be briefly described. The electronic device includes a main board (not shown). The main board may be physically and/or electrically connected to various components. For example, the main board may be connected to the semiconductor package of the embodiment. Various semiconductor devices may be mounted on the semiconductor package.

The semiconductor device may include an active device and/or a passive device. The active device may be a semiconductor chip in the form of an integrated circuit (IC) in which hundreds to millions of devices are integrated in one chip. The semiconductor device may be a logic chip, a memory chip, or the like. The logic chip may be a central processor (CPU), a graphics processor (GPU), or the like. For example, the logic chip may be an application processor (AP) chip including at least one of a central processor (CPU), a graphics processor (GPU), a digital signal processor, a cryptographic processor, a microprocessor and a microcontroller, or an analog-digital converter, an application-specific IC (ASIC), or the like, or a chip set comprising a specific combination of those listed so far.

The memory chip may be a stack memory such as HBM. The memory chip may also include a memory chip such as volatile memory (eg, DRAM), non-volatile memory (eg, ROM), flash memory, and the like.

On the other hand, a product group to which the semiconductor package of the embodiment is applied may be any one of CSP (Chip Scale Package), FC-CSP (Flip Chip-Chip Scale Package), FC-BGA (Flip Chip Ball Grid Array), POP (Package on Package) and SIP (System in Package), but is not limited thereto.

In addition, the electronic device may be a smart phone, a personal digital assistant, a digital video camera, a digital still camera, a vehicle, a high-performance server, a network system, computer, monitor, tablet, laptop, netbook, television, video game, smart watch, automotive, or the like. However, the embodiment is not limited thereto, and may be any other electronic device that processes data in addition to these.

Hereinafter, a semiconductor package including a circuit board according to an embodiment will be described. The semiconductor package of the embodiment may have various package structures including a circuit board to be described later. In addition, the circuit board in one embodiment may be a package substrate described below, and the circuit board in another embodiment may be an interposer described below.

FIG. 2A is a cross-sectional view illustrating a semiconductor package according to a first embodiment, FIG. 2B is a cross-sectional view illustrating a semiconductor package according to a second embodiment, FIG. 2C is a cross-sectional view illustrating a semiconductor package according to a third embodiment, FIG. 2D is a cross-sectional view illustrating a semiconductor package according to a fourth embodiment, FIG. 2E is a cross-sectional view illustrating a semiconductor package according to a fifth embodiment, FIG. 2F is a cross-sectional view illustrating a semiconductor package according to a sixth embodiment, and FIG. 2G is a cross-sectional view illustrating a semiconductor package according to a seventh embodiment.

Referring to FIG. 2A, the semiconductor package according to the first embodiment may include a first substrate 1100, a second substrate 1200, and a semiconductor device 1300.

The first substrate 1100 means a package substrate.

For example, the first substrate 1100 may provide a space to which at least one external substrate is coupled. The external substrate may refer to a second substrate 1200 coupled to the first substrate 1100. Also, the external substrate may refer to a main board included in an electronic device coupled to a lower portion of the first substrate 1100.

Also, although not shown in the drawing, the first substrate 1100 may provide a space in which at least one semiconductor device is mounted.

The first substrate 1100 includes at least one insulating layer, an electrode disposed on the at least one insulating layer, and a through portion passing through the at least one insulating layer.

A second substrate 1200 is disposed on the first substrate 1100.

The second substrate 1200 may be an interposer. For example, the second substrate 1200 may provide a space in which at least one semiconductor device is mounted. The second substrate 1200 may be connected to the at least one semiconductor device 1300. For example, the second substrate 1200 may provide a space in which the first semiconductor device 1310 and the second semiconductor device 1320 are mounted. The second substrate 1200 may electrically connect the first and second semiconductor devices 1310 and 1320 and the first substrate 1100 while electrically connecting the first semiconductor device 1310 and the second semiconductor device 1320. That is, the second substrate 1200 may perform a horizontal connection function between a plurality of semiconductor devices and a vertical connection function between the semiconductor devices and the package substrate.

FIG. 2 illustrates that the first and second semiconductor devices 1310 and 1320 are disposed on the second substrate 1200, but is not limited thereto. For example, one semiconductor device may be disposed on the second substrate 1200, or alternatively, three or more semiconductor devices may be disposed.

The second substrate 1200 may be disposed between the semiconductor device 1300 and the first substrate 1100.

In an embodiment, the second substrate 1200 may be an active interposer that functions as a semiconductor device. When the second substrate 1200 functions as a semiconductor device, the package of the embodiment may have a structure in which a plurality of logic chips are mounted on the first substrate 1100 in a vertically stacked structure. In addition, a first logic chip corresponding to the active interposer among the logic chips may perform a signal transfer function between the second logic chip disposed thereon and the first substrate 1100 while functioning as a corresponding logic chip.

According to another embodiment, the second substrate 1200 may be a passive interposer. For example, the second substrate 1200 may function as a signal relay between the semiconductor device 1300 and the first substrate 1100. For example, a number of terminals of the semiconductor device 1300 is gradually increasing due to 5G, Internet of Things (IoT), increased image quality, and increased communication speed. That is, the number of terminals provided in the semiconductor device 1300 increases, thereby reducing the width of the terminals or an interval between the plurality of terminals. In this case, the first substrate 1100 is connected to the main board of the electronic device. There is a problem in that the thickness of the first substrate 1100 increases or the layer structure of the first substrate 1100 becomes complicated in order for the electrodes provided on the first substrate 1100 to have a width and an interval to be respectively connected to the semiconductor device 1300 and the main board. Accordingly, in the first embodiment, the second substrate 1200 is disposed on the first substrate

1100 and the semiconductor device 1300. In addition, the second substrate 1200 may include electrodes having a fine width and an interval corresponding to the terminals of the semiconductor device 1300.

the semiconductor device 1300 may be an application processor (AP) chip including at least one of a central processor (CPU), a graphics processor (GPU), a digital signal processor, a cryptographic processor, a microprocessor and a microcontroller, or an analog-digital converter, an application-specific IC (ASIC), or the like, or a chip set comprising a specific combination of those listed so far. The memory chip may be a stack memory such as HBM. The memory chip may also include a memory chip such as volatile memory (eg, DRAM), non-volatile memory (eg, ROM), flash memory, and the like.

Meanwhile, the semiconductor package of the first embodiment may include a connection portion.

For example, the semiconductor package includes a first connection portion 1410 disposed between the first substrate 1100 and the second substrate 1200. The first connection portion 1410 electrically connects the second substrate 1200 to the first substrate 1100 while coupling them.

For example, the semiconductor package may include the second connection portion 1420 disposed between the second substrate 1200 and the semiconductor device 1300. The second connection portion 1420 may electrically connect the semiconductor device 1300 to the second substrate 1200 while coupling them.

The semiconductor package includes a third connection portion 1430 disposed on a lower surface of the first substrate 1100. The third connection portion 1430 may electrically connect the first substrate 1100 to the main board while coupling them.

At this time, the first connection portion 1410, the second connection portion 1420, and the third connection portion 1430 may electrically connect between the plurality of components by using at least one bonding method of wire bonding, solder bonding and metal-to-metal direct bonding.

That is, since the first connection portion 1410, the second connection portion 1420, and the third connection portion 1430 have a function of electrically connecting a plurality of components, when the metal-to-metal direct bonding is used, the connection portion of the semiconductor package may be understood as an electrically connected portion, not a solder or wire.

The wire bonding method may refer to electrically connecting a plurality of components using a conductive wire such as gold (Au). Also, the solder bonding method may electrically connect a plurality of components using a material containing at least one of Sn, Ag, and Cu. In addition, the metal-to-metal direct bonding method may refer to recrystallization by applying heat and pressure between a plurality of components without the presence of solder, wire, conductive adhesive, etc. and to directly bond between the plurality of components. In addition, the metal-to-metal direct bonding method may refer to a bonding method by the second connection portion 1420. In this case, the second connection portion 1420 may mean a metal layer formed between a plurality of components by the recrystallization.

Specifically, the first connection portion 1410, the second connection portion 1420, and the third connection portion 1430 may couple a plurality of components to each other by a thermal compression (TC) bonding method. The TC bonding may refer to a method of directly coupling a plurality of components by applying heat and pressure to the first connection portion 1410, the second connection portion 1420, and the third connection portion 1430.

In this case, at least one of the first substrate 1100 and the second substrate 1200 may include a protrusion provided in the electrode on the first connection portion 1410, the second connection portion 1420, and the third connection portion 1430 are disposed. The protrusion may protrude outward from the first substrate 1100 or the second substrate 1200.

The protrusion may be referred to as a bump. The protrusion may also be referred to as a post. The protrusion may also be referred to as a pillar. Preferably, the protrusion may refer to an electrode on which a second connection portion 1420 for coupling with the semiconductor device 1300 is disposed among the electrodes of the second substrate 1200. That is, as a pitch of the terminals of the semiconductor device 1300 is reduced, a short circuit may occur in the second connection portions 1420 respectively connected to the terminals of the semiconductor device 1300. Accordingly, in the embodiment, the protrusion is included in the electrode of the second substrate 1200 on which the second connection portion 1420 is disposed in order to reduce a volume of the second connection portion 1420. The protrusion may improve matching between the electrode of the second substrate 1200 and the terminal of the semiconductor device 1300 and prevent diffusion of the second connection portion 1420.

Meanwhile, referring to FIG. 2B, the semiconductor package of the second embodiment is different from the semiconductor package of the first embodiment in that the connecting member 1210 is disposed on the second substrate 1200. The connecting member 1210 may be referred to as a bridge substrate. For example, the connecting member 1210 may include a redistribution layer.

In an embodiment, the connecting member 1210 may be a silicon bridge. That is, the connecting member 1210 may include a silicon substrate and a redistribution layer disposed on the silicon substrate.

In another embodiment, the connecting member 1210 may be an organic bridge. For example, the connecting member 1210 may include an organic material. For example, the connecting member 1210 includes an organic substrate including an organic material instead of the silicon substrate.

The connecting member 1210 may be embedded in the second substrate 1200, but is not limited thereto. For example, the connecting member 1210 may be disposed on the second substrate 1200 to have a protruding structure.

Also, the second substrate 1200 may include a cavity, and the connecting member 1210 may be disposed in the cavity of the second substrate 1200.

The connecting member 1210 may horizontally connect a plurality of semiconductor devices disposed on the second substrate 1200.

Referring to FIG. 2C, the semiconductor package according to the third embodiment includes a second substrate 1200 and a semiconductor device 1300. In this case, the semiconductor package of the third embodiment has a structure in which the first substrate 1100 is removed compared to the semiconductor package of the second embodiment.

That is, the second substrate 1200 of the third embodiment may function as a package substrate while performing an interposer function.

The first connection portion 1410 disposed on the lower surface of the second substrate 1200 may couple the second substrate 1200 to the main board of the electronic device.

Referring to FIG. 2D, the semiconductor package according to the fourth embodiment includes a first substrate 1100 and a semiconductor device 1300.

In this case, the semiconductor package of the fourth embodiment has a structure in which the second substrate 1200 is removed compared to the semiconductor package of the second embodiment.

That is, the first substrate 1100 of the fourth embodiment may function as an interposer connecting the semiconductor device 1300 and the main board while functioning as a package substrate. To this end, the first substrate 1100 may include a connecting member 1110 for connecting the plurality of semiconductor devices. The connecting member 1110 may be a silicon bridge or an organic material bridge connecting a plurality of semiconductor devices.

Referring to FIG. 2E, the semiconductor package of the fifth embodiment further includes a third semiconductor device 1330 compared to the semiconductor package of the fourth embodiment.

To this end, a fourth connection portion 1440 is disposed on the lower surface of the first substrate 1100.

In addition, a third semiconductor device 1330 may be disposed on the fourth connection portion 1400. That is, the semiconductor package of the fifth embodiment may have a structure in which semiconductor devices are mounted on upper and lower sides, respectively.

In this case, the third semiconductor device 1330 may have a structure disposed on the lower surface of the second substrate 1200 in the semiconductor package of FIG. 2C.

Referring to FIG. 2F, the semiconductor package according to the sixth embodiment includes a first substrate 1100.

A first semiconductor device 1310 may be disposed on the first substrate 1100. To this end, a first connection portion 1410 is disposed between the first substrate 1100 and the first semiconductor device 1310.

In addition, the first substrate 1100 includes a conductive coupling portion 1450. The conductive coupling portion 1450 may further protrude from the first substrate 1100 toward the second semiconductor device 1320. The conductive coupling portion 1450 may be referred to as a bump or, alternatively, may also be referred to as a post. The conductive coupling portion 1450 may be disposed to have a protruding structure on an electrode disposed on an uppermost side of the first substrate 1100.

A second semiconductor device 1320 is disposed on the conductive coupling portion 1450 of the first substrate 1100. In this case, the second semiconductor device 1320 may be connected to the first substrate 1100 through the conductive coupling portion 1450. In addition, a second connection portion 1420 may be disposed on the first semiconductor device 1310 and the second semiconductor device 1320.

Accordingly, the second semiconductor device 1320 may be electrically connected to the first semiconductor device 1310 through the second connection portion 1420.

That is, the second semiconductor device 1320 is connected to the first substrate 1100 through the conductive coupling portion 1450, and is also connected to the first semiconductor device 1310 through the second connection portion 1420.

In this case, the second semiconductor device 1320 may receive a power signal through the conductive coupling portion 1450. Also, the second semiconductor device 1320 may transmit and receive a communication signal to and from the first semiconductor device 1310 through the second connection portion 1420.

The semiconductor package according to the sixth embodiment provides a power signal to the second semiconductor device 1320 through the conductive coupling portion 1450, thereby providing sufficient power for driving the second semiconductor device 1320. Accordingly, the embodiment may improve the driving characteristics of the second semiconductor device 1320. That is, the embodiment may solve the problem of insufficient power provided to the second semiconductor device 1320. Furthermore, in the embodiment, the power signal and the communication signal of the second semiconductor device 1320 are provided through different paths through the conductive coupling portion 1450 and the second connection portion 1420. Through this, the embodiment can solve the problem that the communication signal is lost due to the power signal. For example, the embodiment may minimize mutual interference between communication signals of power signals. Meanwhile, the second semiconductor device 1320 according to the sixth embodiment may have a POP structure and be disposed on the first substrate 1100. For example, the second semiconductor device 1320 may be a memory package including a memory chip. In addition, the memory package may be coupled on the conductive coupling portion 1450. In this case, the memory package may not be connected to the first semiconductor device 1310.

Referring to FIG. 2G, the semiconductor package according to the seventh embodiment includes a first substrate 1100, a first connection portion 1410, a first connection portion 1410, a semiconductor device 1300, and a third connection portion 1430.

In this case, the semiconductor package of the seventh embodiment is different from the semiconductor package of the fourth embodiment in that the first substrate 1100 includes a plurality of substrate layers while the connecting member 1110 is removed.

The first substrate 1100 includes a plurality of substrate layers. For example, the first substrate 1100 may include a first substrate layer 1100A corresponding to a package substrate and a second substrate layer 1100B corresponding to a redistribution layer of the connecting member.

That is, in the first substrate 1100, a second substrate layer 1100B corresponding to a redistribution layer is disposed on the first substrate layer 1100A.

In other words, the semiconductor package of the seventh embodiment includes the first substrate layer 1100A and the second substrate layer 1100B integrally formed. The material of the insulating layer of the second substrate layer 1100B may be different from the material of the insulating layer of the first substrate layer 1100A. For example, the material of the insulating layer of the second substrate layer 1100B may include a photocurable material. For example, the second substrate layer 1100B may be a photo imageable dielectric (PID). In addition, since the second substrate layer 1100B includes a photocurable material, it is possible to miniaturize the electrode. Accordingly, in the seventh embodiment, the second substrate layer 1100B may be formed by sequentially stacking an insulating layer of a photo-curable material on the first substrate layer 1100A and forming a miniaturized electrode on the insulating layer of the photo-curable material. Through this, the second substrate 1100B may be a redistribution layer including a miniaturized electrode.

Hereinafter, the circuit board of the embodiment will be described.

Before describing the circuit board of the embodiment, the circuit board described below may mean any one of a plurality of substrates included in the previous semiconductor package.

For example, the circuit board described below in one embodiment is a first substrate 1100, a second substrate 1200 and a connecting member (or a bridge substrate, 1110, 1210).

FIG. 3A is a view illustrating a panel for manufacturing a circuit board according to an embodiment, and FIG. 3B is a view for explaining a manufacturing process of a circuit board in the panel unit of FIG. 3A.

Referring to FIGS. 3A and 3B, a circuit board is manufactured in a panel unit.

In addition, a device mounting process or a device molding process on a circuit board manufactured in the panel unit is manufactured in a strip unit constituting the panel.

And, when the manufacturing of the circuit board in the strip unit is completed, a plurality of units constituting the strip may be sawed, respectively.

Specifically, referring to FIG. 3A, a basic material for manufacturing a general circuit board may be a copper clad laminate (CCL) type panel 100.

A width in the horizontal direction of the panel 100 may be 415 mm to 430 mm. Also, a width in the vertical direction of the panel 100 may be 510 mm to 550 mm. Here, the width in the horizontal direction of the panel 100 may be the width in a short axis direction, and the width in the vertical direction may be the width in a long axis direction.

In this case, the panel 100 may be divided into a plurality of strips 200. In other words, the panel 100 may be formed of a set of a plurality of strips 200. The plurality of strips 200 may be spaced apart from each other at predetermined intervals in the horizontal and vertical directions within the panel 100. For example, one panel 100 may be divided into 16 strips 200. That is, one panel 100 may be divided into two regions in the horizontal direction and eight regions in the vertical direction.

Meanwhile, each strip 200 may include a plurality of units 300. For example, one strip 200 may include 1,275 units 300, but is not limited thereto. For example, the number of units 300 included in the one strip 200 may decrease or increase according to process capability.

In this case, each unit 300 may have a width of about 3 mm in a horizontal direction and a width of about 2 mm in a vertical direction. Meanwhile, each of the units 300 may refer to a circuit board according to an embodiment.

In other words, one strip 200 includes 1,275 units 300, and the panel 100 includes 16 strips 200. Accordingly, 16 strips 200 and 20,400 units 300 may be included in one panel 100.

For example, when manufacturing a circuit board in units of the panel 100 as shown in FIG. 3A, 20,400 circuit boards can be simultaneously manufactured at a time.

And, when the circuit board is manufactured in units of the panel 100, as shown in FIG. 3B, each strip 200 includes unit regions 300A, 300B, 300C, 300D in which the unit 300 is disposed, and a dummy region DR between the unit regions 300A, 300B, 300C, and 300D. And, when manufacturing for each unit is completed, a process of sawing each of the unit regions 300A, 300B, 300C, and 300D may performed in the dummy region DR based on a sawing line (SL, sawing line) dividing each unit region 300A, 300B, 300C, and 300D.

In this case, one unit 300 may include a plurality of circuit pattern layers, a plurality of insulating layers, and a plurality of through-holes VH having a predetermined size. In addition, a metal material may be filled in the through hole VH to constitute a through electrode.

At this time, about 150 through-holes VH are formed in one unit 200. Accordingly, one panel 100 may include 20,400 units 300 in which about 150 through-holes VH are formed. As a result, more than 3 million through-holes VH are formed in one panel 100.

Here, when voids are included in the insulating layer 40 as in the comparative example, cracks may occur due to an impact applied to the insulating layer 40 in the process of forming the through hole.

In addition, when the upper surface of the insulating layer 40 has a curvature as in the comparative example, the unit, further the strip, and further the panel are bent, and accordingly, there is a problem in that the formation position of the through-hole is shifted during the formation of the through-hole.

Accordingly, the embodiment provides a circuit board having a new structure for solving the above problems and a method of manufacturing the same.

—Circuit Board of the First Embodiment—

FIG. 4A is a cross-sectional view of the circuit board according to a first embodiment, and FIGS. 4B and 4C are plan views of the circuit board of the first embodiment as viewed from above.

Preferably, FIG. 4A is a cross-sectional view taken along the direction B-B' of FIG. 3B. Also, FIG. 4C is a plan view of the circuit board in a state in which the first protective layer 360 is removed in FIG. 4B as viewed from above.

Hereinafter, the circuit board according to the first embodiment will be described in detail with reference to FIGS. 4A to 4C.

The circuit board of the embodiment provides a mounting space in which at least one chip can be mounted. The number of chips mounted on the circuit board of the embodiment may be one, alternatively may be two, or alternatively there may be three or more. For example, one processor chip may be mounted on the circuit board, alternatively, at least two processor chips having different functions may be mounted on the circuit board, alternatively, one memory chip may be mounted together with one processor chip, and alternatively, at least two processor chips having different functions and at least one memory chip may be mounted.

The circuit board includes an insulating layer 330. The insulating layer 330 has a structure of at least one layer. At this time, although FIG. 3A illustrates that the circuit board has a one-layer structure based on the number of layers of the insulating layer 330, the embodiment is not limited thereto. For example, the circuit board may have a stacked structure of two or more layers based on the number of layers of the insulating layer 330.

However, the circuit board of the embodiment is characterized in the structure of the first circuit pattern 310, the insulating layer 330, and the first protective layer 360 disposed on an uppermost side, and accordingly, the circuit board will be described as being composed of one layer for convenience of description. In this case, the first protective layer 360 may also be referred to as an insulating layer. However, hereinafter, it will be functionally described as a first protective layer.

On the other hand, when the circuit board has a plurality of layer structures based on the number of insulating layers, the insulating layer 330 to be described below may represent the uppermost insulating layer disposed on the uppermost of the multilayer insulating layers. In addition, when the circuit board has a plurality of layers based on the number of insulating layers, the first circuit patterns 310 and 320 described below may be an uppermost circuit patterns buried in the upper surface of the uppermost insulating layer. For example, the first circuit patterns 310 and 320 may refer to circuit patterns formed first in a process of manufacturing a circuit board by the ETS method.

The insulating layer 330 may include a prepreg (PPG). The prepreg may be formed by impregnating a fiber layer in the form of a fabric sheet, such as a glass fabric woven with glass yarn, with an epoxy resin, and then performing thermocompression. However, the embodiment is not limited thereto, and the prepreg constituting the insulating layer 330 may include a fiber layer in the form of a fabric sheet woven with carbon fiber yarn.

The insulating layer 330 may include a resin and a reinforcing fiber disposed in the resin. The resin may be an epoxy resin, but is not limited thereto. The resin is not particularly limited to the epoxy resin, and for example, one or more epoxy groups may be included in the molecule, or alternatively, two or more epoxy groups may be included, or alternatively, four or more epoxy groups may be included. In addition, the resin of the insulating layer 330 may include a naphthalene group, for example, may be an aromatic amine type, but is not limited thereto. For example, the resin may be include a bisphenol A type epoxy resin, a bisphenol F type epoxy resin, a bisphenol S type epoxy resin, a phenol novolac type epoxy resin, an alkylphenol novolac type epoxy resin, a biphenyl type epoxy resin, an aralkyl type epoxy resin, dicyclopentadiene type epoxy resin, naphthalene type epoxy resin, naphthol type epoxy resin, epoxy resin of condensate of phenol and aromatic aldehyde having phenolic hydroxyl group, biphenyl aralkyl type epoxy resin, fluorene type epoxy resin resins, xanthene-type epoxy resins, triglycidyl isocyanurate, rubber-modified epoxy resins, phosphorous-based epoxy resins, and the like, and naphthalene-based epoxy resins, bisphenol A-type epoxy resins, and phenol novolac epoxy resins, cresol novolak epoxy resins, rubber-modified epoxy resins, and phosphorous-based epoxy resins. In addition, the reinforcing fiber may include glass fiber, carbon fiber, aramid fiber (eg, aramid-based organic material), nylon, silica-based inorganic material or titania-based inorganic material. The reinforcing fibers may be arranged in the resin to cross each other in a planar direction.

Meanwhile, the glass fiber, carbon fiber, aramid fiber (eg, aramid-based organic material), nylon, silica-based inorganic material or titania-based inorganic material may be used.

However, the embodiment is not limited thereto, and the insulating layer 330 may include other insulating materials.

For example, the insulating layer 330 may be rigid or may be flexible. For example, the insulating layer 330 may include glass or plastic. In detail, the insulating layer 330 may include chemically strengthened/semi-tempered glass such as soda lime glass or aluminosilicate glass, or strengthened or flexible plastic such as polyimide (PI), polyethylene terephthalate (PET), propylene glycol (PPG) and polycarbonate (PC), or sapphire. For example, the insulating layer 330 may include an optical isotropic film. For example, the insulating layer 330 may be includes COC (cyclic Olefin Copolymer), COP (Cyclic Olefin Polymer), photo isotropic polycarbonate (polycarbonate, PC), or photo isotropic polymethyl methacrylate (PMMA). For example, the insulating layer 330 may be formed of a material including an inorganic filler and an insulating resin. For example, the insulating layer 330 may be formed of a material including an inorganic filler and an insulating resin. For example, the insulating layer 330 may be formed of a thermosetting resin such as an epoxy resin, resins containing reinforcing materials such as inorganic fillers such as silica and alumina together with thermoplastic resins such as polyimide, specifically Ajinomoto Build-up Film (ABF), FR-4, Bismaleimide Triazine (BT), Photo Imageable Dielectric resin (PID), BT, or the like may be used.

The insulating layer 330 may have a thickness in the range of 10 μm to 60 μm. For example, each of the insulating layers 330 may have a thickness in a range of 12 μm to 40 μm. When the thickness of the insulating layer 330 is less than 5 μm, the circuit pattern included in the circuit board may not be stably protected. When the thickness of the insulating layer 330 exceeds 80 μm, the overall thickness of the circuit board may increase. In addition, when the thickness of the insulating layer 330 exceeds 80 μm, a thickness of a circuit pattern or a via may increase correspondingly, and accordingly, loss of a signal transmitted through the circuit pattern may increase.

In this case, the thickness of the insulating layer 330 may correspond to a distance in the thickness direction between circuit patterns disposed on different layers. For example, the thickness of the insulating layer 330 may mean a vertical distance from the lower surface of the first circuit patterns 310 and 320 to the upper surface of the second circuit pattern 350.

A circuit pattern is disposed on the surface of the insulating layer 330.

For example, first circuit patterns 310 and 320 may be disposed on the upper surface of the insulating layer 330. For example, a second circuit pattern 350 may be disposed on a lower surface of the insulating layer 330.

In an embodiment, the circuit board may be manufactured using an Embedded Trace Substrate (ETS) method. Accordingly, at least one of the circuit patterns included in the circuit board may have an ETS structure. Here, having the ETS structure may mean having a structure in which the outermost circuit pattern disposed at the outermost portion is buried in the outermost insulating layer. In other words, a cavity concave toward the lower side is formed on the upper surface of the uppermost insulating layer disposed on the uppermost side of the circuit board in the ETS structure, and accordingly, it may mean that the circuit pattern disposed on the uppermost side of the circuit board has a structure disposed on the cavity of the uppermost insulating layer.

For example, a circuit pattern disposed on at least one of the circuit patterns disposed on each layer of the circuit board may have a structure buried in an insulating layer. For example, in an embodiment, the circuit pattern disposed on the upper surface of the first uppermost insulating layer may have an ETS structure. For example, in an embodiment, the first circuit patterns 310 and 320 disposed on the upper surface of the insulating layer 330 may have an ETS structure. However, the embodiment is not limited thereto, and depending on the arrangement direction of the circuit board, the circuit pattern disposed on the lowermost side of the circuit board may have an ETS structure. Hereinafter, for convenience of description of the embodiment, a circuit pattern disposed on the uppermost side of the circuit board will be described as having an ETS structure.

The first circuit patterns 310 and 320 may have a structure buried in the insulating layer 330. For example, a part of the first circuit patterns 310 and 320 may have a structure buried in the insulating layer 330. For example, an entire region of the first circuit patterns 310 and 320 may have a structure buried in the insulating layer 330.

Here, the structure in which the first circuit patterns 310 and 320 are buried in the insulating layer 330 may mean that at least a portion of a side surface of the first circuit patterns 310 and 320 is covered with the insulating layer 330.

In addition, the fact that the first circuit patterns 310 and 320 have an ETS structure may mean that the upper surfaces of the first circuit patterns 310 and 320 and the upper surfaces of the insulating layer 330 do not vertically overlap.

Meanwhile, lower surfaces of the first circuit patterns 310 and 320 may be covered by the insulating layer 330.

Meanwhile, the second circuit pattern 350 may be disposed on the lower surface of the insulating layer 330. The second circuit pattern 350 may protrude under the insulating layer 330.

The circuit patterns as described above may be formed of at least one metal material selected from gold (Au), silver (Ag), platinum (Pt), titanium (Ti), tin (Sn), copper (Cu), and zinc (Zn). In addition, the circuit patterns may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the circuit patterns may be formed of copper (Cu) having high electrical conductivity and a relatively inexpensive price.

The first circuit patterns 310 and 320 and the second circuit pattern 350 may have a thickness in a range of 5 μm to 20 μm. For example, the first circuit patterns 310 and 320 and the second circuit pattern 350 may have a thickness in a range of 6 μm to 17 μm. The first circuit patterns 310 and 320 and the second circuit pattern 350 may have a thickness in a range of 7 μm to 16 μm. When the thickness of the first circuit patterns 310 and 320 and the second circuit pattern 350 is less than 5 μm, the resistance of the circuit pattern may increase, and thus signal transmission efficiency may decrease. For example, when the thickness of the first circuit patterns 310 and 320 and the second circuit pattern 350 is less than 5 μm, signal transmission loss may increase. For example, when the thickness of the first circuit patterns 310 and 320 and the second circuit pattern 350 exceeds 20 μm, the line widths of the circuit patterns increase, and accordingly, the overall volume of the circuit board may increase.

The circuit board of the embodiment includes the through electrode 340.

The through electrode 340 penetrates the insulating layer 330 included in the circuit board, and thus may electrically connect circuit patterns disposed on different layers.

The through electrode 340 may electrically connect between the first circuit patterns 310 and 320 and the second circuit pattern 350. For example, an upper surface of the through electrode 340 may be directly connected to the lower surface of at least one of the first circuit patterns 310 and 320, and a lower surface of the through electrode 340 may be directly connected to an upper surface of at least one of the second circuit patterns 350.

In this case, the through electrode 340 may have a slope that gradually increases in width from the upper surface of the insulating layer 330 to the lower surface of the insulating layer 330. That is, the through electrode 340 is manufactured by the ETS method, and thus is formed by filling the inside of the through hole formed by the laser process on the lower surface of the insulating layer 330. Accordingly, the through electrode 340 may have a trapezoidal shape in which the width of the upper surface is narrower than the width of the lower surface.

The through hole may be formed by any one of mechanical, laser, and chemical processing. When the via through is formed by machining, methods such as milling, drilling, and routing may be used, when formed by laser processing, a UV or CO2 laser method may be used, when formed by chemical, a chemical containing aminosilane, ketones, or the like. Accordingly, at least one of plurality of insulating layers may be opened.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultra-violet (UV) laser. YAG laser is a laser that can process both copper foil layers and insulating layers, and CO2 laser is a laser that can process only insulating layers.

When the through hole is formed, the through electrode 340 may be formed by filling the inside of the through hole with a conductive material. The metal material forming the through electrode 340 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, inkjetting and dispensing.

Meanwhile, the circuit board of the embodiment may include a first protective layer 360 and a second protective layer 380. The first protective layer 360 and the second protective layer 380 may be respectively disposed on the uppermost side and the lowermost side of the circuit board.

The first protective layer 360 may be disposed on the uppermost insulating layer disposed on an uppermost portion of the circuit board. For example, the first protective layer 360 may be disposed on the upper surface of the insulating layer 330.

For example, the second protective layer 380 may be disposed on a lower surface of the lowermost insulating layer disposed on the lowermost side of the circuit board. For example, the second protective layer 380 may be disposed on the lower surface of the insulating layer 330.

The first protective layer 360 may include an opening. The opening of the first protective layer 360 may vertically overlap the top surface of the insulating layer 330, and may vertically overlap the upper surface of at least one of the first circuit patterns 310 and 320.

For example, the first circuit patterns 310 and 320 include a pad portion 310. The pad portion 310 may be plural. In addition, the first protective layer 360 may include a first opening OR1 that vertically overlaps with at least a part of an upper surface of the pad portion 310. For example, the upper surface of the pad portion 310 may be divided into a plurality of regions. For example, the upper surface of the pad portion 310 may include an overlapping region vertically overlapping with the first protective layer 360 and non-overlapping regions R2 and R2-1 other than the overlapping region. For example, the upper surface of the pad portion 310 may include regions R2 and R2-1 that vertically overlap with the first opening OR1 of the first protective layer 360.

In addition, the first protective layer 360 may include a second opening OR2 that vertically overlaps the upper surface of the insulating layer 330.

Meanwhile, a first surface treatment layer 370 may be disposed on the pad portion 310. In addition, a second surface treatment layer 380 may be disposed on a lower surface of the second circuit pattern 350.

For example, the first surface treatment layer 370 may be disposed on an upper surface of the pad portion 310 that vertically overlaps the first opening OR1 of the first protective layer 360. In addition, the second surface treatment layer 380 may be disposed on a lower surface of the second circuit pattern 350 vertically overlapping with an opening (not shown) of the second protective layer 380.

The first surface treatment layer 370 may be an Organic Solderability Preservative (OSP) layer. For example, the first surface treatment layer 370 may be an organic layer formed of an organic material such as benzimidazole coated on the pad portion 310.

Also, the first surface treatment layer 370 may be a plating layer.

Preferably, the first surface treatment layer 370 may be a plating layer formed by performing plating through a plating lead, which will be described later.

For example, the first surface treatment layer 370 may be composed of one plating layer, or alternatively, may be composed of a plurality of plating layers.

For example, the first surface treatment layer 370 may be formed of only a gold (Au) plating layer disposed on the upper surface of the pad portion 310.

In another example, the first surface treatment layer 370 may include a nickel (Ni) plating layer disposed on the upper surface of the pad portion 310 and a gold (Au) plating layer disposed on the nickel (Ni) plating layer.

In another example, the first surface treatment layer 370 includes a nickel (Ni) plating layer disposed on the upper surface of the pad portion 310, a palladium (Pd) plating layer disposed on the nickel (Ni) plating layer, and a gold (Au) plating layer disposed on the palladium (Pd) plating layer.

Hereinafter, the structure of the upper surface of the insulating layer 330, the structure of the first circuit patterns 310 and 320, and the structure of the first protective layer 360 will be described in detail.

In this case, FIGS. 4A, 4B, and 4C show a region adjacent to the outermost end of the circuit board while including the outermost end of the circuit board.

The insulating layer 330 may have a first width W1. The first width W1 may mean a horizontal distance between two outermost ends of the insulating layer 330 facing each other.

The first protective layer 360 may have a second width W2. For example, the first protective layer 360 may have a second width W2 that is narrower than the first width W1 of the insulating layer 330. In this case, the first protective layer 360 having a narrower width than the insulating layer 330 is because a portion of the upper surface of the insulating layer 330 vertically overlaps the second opening OR2 of the first protective layer 360.

That is, a part of the upper surface of the insulating layer 330 may be exposed through the second opening OR2 of the first protective layer 360. Accordingly, the first width W1 of the insulating layer 330 may be as large as the width of the second opening OR2 compared to the second width W2 of the first protective layer 360.

For example, the upper surface of the insulating layer 330 may be divided into a plurality of regions. In this case, the upper surface of the insulating layer 330 does not vertically overlap the first circuit patterns 310 and 320. Accordingly, the upper surface of the insulating layer 330 may mean a region that does not vertically overlap the upper surface of the first circuit patterns 310 and 320.

For example, an upper surface of the insulating layer 330 may include a first region R1 vertically overlapping with the first protective layer 360.

In addition, an upper surface of the insulating layer 330 in the first region R1 may be covered with the first protective layer 360.

In addition, the upper surface of the insulating layer 330 may include second regions R2 and R2-2 other than the first region R1. For example, an upper surface of the insulating layer 330 may include second regions R2 and R2-2 that do not vertically overlap the first protective layer 360. For example, the second regions R2 and R2-2 of the upper surface of the insulating layer 330 may mean a region that vertically overlaps with the second opening OR2 of the first protective layer 360.

In this case, the second regions R2 and R2-2 of the upper surface of the insulating layer 330 may be adjacent to an outermost end 330MS of the insulating layer 330. For example, the second regions R2 and R2-2 of the upper surface of the insulating layer 330 may be edge regions of the upper surface of the insulating layer 330 connected to the outermost end 330MS of the insulating layer 330. Meanwhile, the circuit board in the drawing does not represent the entire region of the circuit board, but a partial region thereof (eg, a region adjacent to the outermost end 330MS of the insulating layer). Accordingly, one side 330IS of the insulating layer 330 in the drawing does not mean the other outermost end (eg, the left side) opposite to the outermost end 330MS of the insulating layer 330, and may mean a cut surface between the outermost end 330MS and the other outermost end.

In addition, the structural features described below can be equally applied to the region adjacent to the other outermost end of the insulating layer 330 as well se to the region adjacent to the outermost end 330MS of the insulating layer 330.

In this case, the first circuit patterns 310 and 320 include a pad portion 310 and an extension portion 320 connected to the pad portion 310. The pad portion 310 may be a mounting pad on which a chip is mounted or a terminal pad for connection with another external board, but is not limited thereto.

In addition, the extension portion 320 may mean a trace connected to the pad portion 310, but is not limited thereto.

In this case, the extension portion 320 of the first circuit pattern may be connected to the pad portion 310 and, accordingly, may extend toward the second regions R2 and R2-2 of the upper surface of the insulating layer 330. For example, the upper surface of the insulating layer 330 may include a plurality of extension portions, at least one of the extension portions is connected to at least one of the pad portions 310, and thus may extend toward the second regions R2 and R2-2 of the upper surface of the insulating layer 330.

In this case, the extension portion 320 may include a step portion SP. The step portion SP may mean a portion of the extension portion 320 in which the width varies. For example, the extension portion 320 may include a first portion 321 adjacent to the pad portion 310, and a second portion 322 extending from the first portion 321 toward the second regions R2 and R2-2 of the upper surface of the insulating layer 330.

In this case, the width W3 of the first portion 321 of the extension portion 320 may be different from the width W4 of the second portion 322 of the extension portion 320. Preferably, the width W3 of the first portion 321 of the extension portion 320 may be smaller than the width W4 of the second portion 322.

That is, the width of one end of the extension 320 may be different from the width of the other end opposite thereto. That is, one end of the extension portion 320 is a portion connected to the pad portion 310, and the other end of the extension portion 320 may mean a portion closest to the second region of the upper surface of the insulating layer 330.

In addition, in the extension portion 320 of the embodiment, the width of the portion closest to the second regions R2 and R2-2 of the upper surface of the insulating layer 330 may be wider than a width in a portion adjacent to the pad portion 310.

Accordingly, the extension portion 320 may include a step portion SP having a varying width at an adjacent portion in the second regions R2 and R2-2 of the upper surface of the insulating layer 330.

The step portion SP may be used to improve the reliability of lamination of the insulating layer 330 when the insulating layer 330 is laminated in the circuit board manufacturing process. For example, the density of the first circuit pattern is low in the second regions R2 and R2-2 of the upper surface of the insulating layer 330, and accordingly, voids may be provided in the second regions R2 and R2-2 of the upper surface of the insulating layer 330. For example, the density of the first circuit pattern is low in the second regions R2 and R2-2 of the upper surface of the insulating layer 330, and accordingly, the second region R2 and R2-2 of the upper surface of the insulating layer 330 may be bent. Accordingly, in the embodiment, the upper surface of the insulating layer 330 has a stepped portion SP in which the width of the extension portion 320 varies in a portion adjacent to the second regions R2 and R2-2. And, the step portion SP serves to increase the density of the first circuit pattern in the second regions R2 and R2-2 of the upper surface of the insulating layer 330, and accordingly, voids may not be included in the insulating layer 330 or the upper surface of the insulating layer 330 may have a flat surface rather than a curved shape.

Meanwhile, a recess 330R may be formed in the second regions R2 and R2-2 of the upper surface of the insulating layer 330. For example, a recess 330R concave toward the lower surface of the insulating layer 330 may be formed in the second regions R2 and R2-2 of the upper surface of the insulating layer 330.

Accordingly, the second regions R2 and R2-2 of the upper surface of the insulating layer 330 may be positioned lower than the first region R1 of the upper surface of the insulating layer 330. For example, at least a part of the second regions R2 and R2-2 of the upper surface of the insulating layer 330 may be lower than the first region R1 of the upper surface of the insulating layer 330. For example, at least a part of the second regions R2 and R2-2 of the upper surface of the insulating layer 330 may have a step difference from the first region R1 of the upper surface of the insulating layer 330 by a depth of the recess 330R.

In this case, the recess 330R may be a region in which a part of the extension portion 320 is disposed in the manufacturing process of the circuit board, and thus may be a region in which a part of the extension portion 320 is removed as the manufacturing of the circuit board is completed.

Accordingly, the recess 330R may have a shape corresponding to the extension portion 320. For example, the recess 330R may have a shape corresponding to the second portion 322 adjacent to the second regions R2 and R2-2 of the upper surface of the insulating layer 330 in the extension portion 320. In this case, having the corresponding shape may mean that the width of the recess 330R is the same as the width of the second portion 322 of the extension portion 320. For example, having the corresponding shape may mean that the depth of the recess 330R is equal to the thickness of the second portion 322 of the extension portion 320. For example, a bottom surface of the recess 330R may be positioned on the same plane as a bottom surface of the first circuit pattern.

Meanwhile, in the embodiment, the portion in which the recess 330R is formed may be covered with the protective layer 360. And, in this case, the extension portion 320 may be disposed in the recess 330R. In addition, the second portion 322 of the extension portion 320 may vertically overlap the outermost end 330MS of the insulating layer 330.

However, in this case, warpage may be severely generated in the manufacturing process of the circuit board. For example, when manufacturing a circuit board by the ETS method, the circuit pattern disposed on the uppermost side of the circuit board is embedded in the insulating layer, and the circuit pattern disposed on the lowermost side has a mutually asymmetric structure protruding below the surface of the insulating layer. In addition, in the asymmetric structure as described above, warpage of the circuit board may become severe. Accordingly, in the embodiment, the warpage is solved by adjusting the volume of the first protective layer 360 and the volume of the second protective layer 380. For example, the volume of the first protective layer 360 may be lower than that of the second protective layer 380 to solve warpages occurring in the asymmetric structure. Accordingly, the first protective layer 360 includes a second opening OR2 that vertically overlaps with the second regions R2 and R2-1 of the upper surface of the insulating layer 330. In addition, when a portion of the extension portion 320 is present in a region vertically overlapping with the second opening OR2, an electrical reliability problem may occur. For example, when a circuit pattern is present in a portion vertically overlapping with the second opening OR2 of the first protective layer 360, the circuit pattern is not protected by other components of the circuit board, and this may cause short circuits and other electrical reliability problems in the manufacturing process. Accordingly, in the embodiment, the second opening OR2 of the first protective layer 360 is positioned to vertically overlap with the second regions R2 and R2-1 of the upper surface of the insulating layer 330 in order to solve the warpage problem and the electrical reliability problem as described above. And, a recess 330R that is a portion from which the extension 320 is removed may be formed in the second regions R2 and R2-1 of the upper surface of the insulating layer 330 that vertically overlap the second opening OR2 of the first protective layer 360.

Meanwhile, in the embodiment, the first circuit patterns 310 and 320 may be described as a structure disposed in a cavity formed on the upper surface of the insulating layer 330.

For example, a cavity concave toward the lower surface may be formed on the upper surface of the insulating layer 330. In addition, the first circuit patterns 310 and 320 may be disposed in the cavity on the upper surface of the insulating layer 330. In this case, the cavity may include a first cavity in which the pad portion 310 of the first circuit pattern is disposed and a second cavity in which the extension portion 320 is disposed. In addition, the second cavity may include a step portion whose width varies toward the second regions R2 and R2-1 of the upper surface of the insulating layer 330. Accordingly, the extension portion 320 of the first circuit pattern disposed in the step portion of the second cavity may also include a step portion whose width varies toward the second regions R2 and R2-1.

In this case, the extension portion 320 of the first circuit patterns 310 and 320 may be formed to fill only a part of the second cavity. For example, the second cavity may include a region that vertically overlaps with the first protective layer 360 and a region other than the region. In addition, the second cavity may include a region that vertically overlaps with the second opening OR2 of the first protective layer 360. For example, the second cavity may include a region that vertically overlaps with the second regions R2 and R2-1 of the upper surface of the insulating layer 330. In addition, the extension portion 320 of the first circuit pattern may not be disposed in the second cavity formed in the second regions R2 and R2-1 of the upper surface of the insulating layer 330. Accordingly, the second cavity formed in the second regions R2 and R2-1 of the upper surface of the insulating layer 330 may correspond to the recess 330R because the extension portion 320 is not disposed.

The circuit board of the embodiment includes an insulating layer, a first circuit pattern disposed on the insulating layer, and a protective layer disposed on the insulating layer and having a width narrower than that of the insulating layer, wherein an upper surface of the insulating layer includes a first region overlapping the protective layer and a second region excluding the first region, wherein at least one of the first circuit pattern includes a pad portion, and an extension portion extending from the pad portion toward the second region, and wherein the extension portion includes a step portion having a width varying in a portion adjacent to the second region. Here, the step portion is characterized in that the width increases in a region adjacent to the second region of the upper surface of the insulating layer. That is, the extension portion includes a first portion adjacent to the pad portion and a second portion adjacent to the second region of the upper surface of the insulating layer, and a width of the second portion is greater than a width of the first portion. The embodiment can solve the void problem caused by the low density of the circuit pattern in the second region of the upper surface of the insulating layer when manufacturing the circuit board by the ETS method, and accordingly, the physical reliability of the circuit board may be improved.

Furthermore, the protective layer disposed on the upper surface of the insulating layer in the embodiment includes a second opening vertically overlapping with the second region of the insulating layer. In this case, the second opening may vertically overlap the protective layer disposed on a lower surface of the insulating layer. Preferably, the width of the protective layer on the upper surface of the insulating layer may be greater than a width of the protective layer on the lower surface of the insulating layer. Accordingly, the embodiment may minimize warpages occurring in a circuit board having an ETS structure having an asymmetric structure, and thus may improve physical reliability and electrical reliability of the circuit board.

—Package Substrate—

Meanwhile, at least one chip may be mounted on the circuit board according to the embodiment, and may be provided as a package substrate through this. The package substrate may be a detailed representation of a partial region of the above-described semiconductor package.

For example, the package substrate of the embodiment includes at least one chip mounted on the circuit board of FIG. 4A, a molding layer for molding the chip, and a connection portion for coupling with the chip or an external substrate.

For example, the package substrate includes a first connection portion (not shown) disposed on a pad portion 310 of a first circuit pattern disposed on the uppermost side of the circuit board, and preferably a first surface treatment layer 370. The first connection portion may be a solder ball.

In addition, a chip may be mounted on the solder ball. In this case, the chip may be a processor chip. For example, the chip may be an application processor (AP) chip among a central processor (eg, CPU), a graphic processor (eg, GPU), a digital signal processor, an encryption processor, a microprocessor, and a microcontroller.

In this case, at least two chips may be mounted on the circuit board of the embodiment. In an embodiment, at least two chips of a central processor (eg, CPU), a graphic processor (eg, GPU), a digital signal processor, an encryption processor, a microprocessor, and a microcontroller may be disposed on the circuit board at regular intervals. For example, the package substrate in the embodiment may include a central processor chip and a graphic processor chip, but is not limited thereto.

Meanwhile, the plurality of chips may be spaced apart from each other by a predetermined interval on the circuit board. For example, the interval between the plurality of chips may be 150 μm or less. For example, the interval between the plurality of chips may be 120 μm or less. For example, the interval between the plurality of chips may be 100 μm or less.

Preferably, the interval between the plurality of chips may have a range of 60 μm to 150 μm. Preferably, the interval between the plurality of chips may have a range of 70 μm to 120 μm. Preferably, the interval between the plurality of chips may have a range of 80 μm to 110 μm. When the interval between the plurality of chips is less than 60 μm, a problem in operation reliability may occur due to interference between the plurality of chips. When the spacing between the plurality of chips is greater than 150 μm, as the distance between the plurality of chips increases, signal transmission loss may increase. When the spacing between the plurality of chips is greater than 150 μm, the volume of the package substrate may increase.

—Manufacturing Method of Circuit Board—

Hereinafter, a method of manufacturing a circuit board according to an embodiment will be described.

Hereinafter, for convenience of description, in the strip region of the panel, a part of the region including the two units will be mainly described.

FIGS. 5A to 5L are views for explaining the manufacturing method of the circuit board according to the first embodiment in a process order.

In an embodiment, the manufacturing of a plurality of circuit boards (eg, a plurality of units) may be performed simultaneously in a panel unit or a strip unit.

Referring to FIG. 5A, an embodiment prepares a carrier board for manufacturing the circuit board.

The carrier board may include a carrier insulating layer CB1 and a carrier copper foil layer CB2 disposed on the carrier insulating layer CB1.

In this case, the carrier copper foil layer CB2 may be disposed on at least one of an upper surface and a lower surface of the carrier insulating layer CB1. For example, the carrier copper foil layer CB2 may be disposed on only one surface of the carrier insulating layer CB1. As another example, the carrier copper foil layer CB2 may be disposed on both surfaces of the carrier insulating layer CB1.

In addition, when the carrier copper foil layer CB2 is disposed on both surfaces of the carrier insulating layer CB1, the circuit board manufacturing process may be simultaneously performed on both surfaces of the carrier insulating layer CB1.

However, for the convenience of description, the embodiment will be described with the assumption that the manufacturing process of the circuit board is performed only on the lower side of the carrier board.

In this case, the carrier insulating layer CB1 and the carrier copper foil layer CB2 may be CCL (Copper Clad Laminate).

Next, in the embodiment, a process of forming a circuit pattern on the lower surface of the carrier copper foil layer CB2 may be performed.

In this case, the lower surface of the carrier copper foil layer CB2 may be divided into a plurality of regions. For example, a lower surface of the carrier copper foil layer CB2 includes a first unit region U1 corresponding to a first circuit board, a second unit region U2 corresponding to a second circuit board, and a dummy region between the first unit region and the second unit region.

In addition, the circuit pattern may be formed in all of the first unit region U1, the second unit region U2, and the dummy region.

Preferably, a plating lead 410 for performing plating to form the first surface treatment layer 370 is formed in the dummy region.

In addition, the pad portion 310 and the extension portion 320 of the first circuit pattern are formed in the first unit region U1 and the second unit region U2, respectively. In addition, the extension portion 320 may extend to the dummy region, and thus may be connected to the plating lead 410. Accordingly, the extension portion 320 may be used as a plating seed layer for plating the first surface treatment layer 370 during the manufacturing process of the circuit board.

In this case, the extension portion 320 in the embodiment includes a step portion SP.

For example, the extension portion 320 may include a first portion 321 adjacent to the pad portion 310, and a second portion 322 extending from the first portion 321 toward the dummy region and connected to the plating lead 410. In addition, the width of the first portion 321 and the width of the second portion 322 may be different from each other. Preferably, the width of the first portion 321 may be narrower than the width of the second portion 322. That is, the extension portion 320 may include a portion that becomes wider from the pad portion 310 to the plating lead 410. Accordingly, the embodiment increases the density of the circuit pattern according to the step portion of the second portion 322 of the extension portion 320.

That is, the edge region of the first unit region U1 and the second unit region U2 adjacent to the dummy region among the lower surfaces of the carrier copper foil layer CB2 has a low circuit pattern density, and accordingly, voids may occur in the subsequent lamination process of the insulating layer 330. In the embodiment, the first extension portion 320 includes a step portion SP that is widened in the edge region of the first unit region U1 and the second unit region U2, and accordingly, it is possible to prevent the generation of voids due to the difference in density of the circuit patterns.

For example, FIG. 5B is a view showing the extension portion 320a in the comparative example.

As shown in FIG. 5B, in the comparative example, the pad portion 310a and the extension portion 320a are formed on the lower surface of the carrier copper foil layer CB2. In this case, the extension portion 320a may connect between the pad portion 310a and the plating lead 410a. In this case, the width of the extension portion 320a does not change between the plating lead 410a and the pad portion 310a. For example, the extension portion 320a in the comparative example extends with the same width without changing the width between the pad portion 310*a* and the plating lead 410*a*.

Accordingly, in the comparative example, there is a problem in that voids are generated due to a low density of circuit patterns in an edge region (ER) adjacent to the dummy region in the process of laminating an insulating layer after the pad part 310*a* and the extension part 320*a* are formed.

On the other hand, in the embodiment, the extension portion 320 includes a step portion having a width widening in a region adjacent to the dummy region in order to increase the density of the circuit pattern in the dummy region and the adjacent edge region, where the density of the circuit pattern is relatively low. Accordingly, the embodiment can solve the problem of voids occurring in the edge region.

Next, as shown in FIG. 5C, the embodiment provides an insulating layer 330 covering the pad portion 310, the extension portion 320, and the plating lead 410 of the first circuit pattern on the lower surface of the carrier copper foil layer CB2. For example, the insulating layer 330 may be entirely formed on the lower surface of the carrier copper foil layer CB2. In this case, in the embodiment, the extension portion 320 has a step portion with a width widening in the edge region adjacent to the dummy region, and accordingly, the formation of voids in the edge region in the stacking process of the insulating layer 330 is prevented.

Next, in the embodiment, as shown in FIG. 5D, a process of forming a through hole VH passing through the insulating layer 330 may be performed.

The through hole VH may be formed by a laser process, but is not limited thereto. In this case, the through hole VH may vertically overlap with the lower surface of at least one of the pad portions 310 of the first circuit pattern formed on the lower surface of the carrier copper foil layer CB2.

Next, as shown in FIG. 5E, in the embodiment, a process of forming a seed layer on a lower surface of the insulating layer 330 and an inner wall of the through hole VH, and forming the through electrode 340 filling the through hole VH and the second circuit pattern 350 disposed on the lower surface of the insulating layer 330 by performing electroplating may be performed.

Next, as shown in FIG. 5F, in the embodiment, a process of removing the carrier insulating layer CB1 may be performed.

Next, as shown in FIG. 5G, the embodiment may proceed with a process of removing the carrier copper foil layer CB2. FIG. 5G (a) is a cross-sectional view of a state in which the carrier copper foil layer CB2 is removed, and FIG. 5G (b) is a plan view of the substrate in a state in which the carrier copper foil layer CB2 is removed, as viewed from above.

Next, as shown in FIG. 5H, in the embodiment, the process of forming the first protective layer 360 on the upper surface of the insulating layer 330 and forming the second protective layer 380 on the lower surface of the insulating layer 330 may be performed.

Thereafter, the embodiment may proceed with a process of forming openings in the first protective layer 360 and the second protective layer 380, respectively. In this case, the opening OR3 formed in the second protective layer 380 may vertically overlap the lower surface of a portion of the second circuit patterns 350 disposed on the lower surface of the insulating layer 330.

In addition, the opening formed in the first protective layer 360 in the embodiment may vertically overlap the pad portion 310 of the first circuit pattern, and vertically overlap the upper surface of the insulating layer 330.

For example, in an embodiment, a first opening OR1 vertically overlapping with the upper surface of the pad part 310 of the first circuit pattern in the first protective layer 360 and a second opening OR2 vertically overlapping with the upper surface of the insulating layer 330 and the upper surface of the extension portion 320 is formed.

In this case, the second opening OR2 may be formed in a region adjacent to the dummy region. In addition, the second opening OR2 may vertically overlap a region adjacent to the plating lead 410 of the extension portion 320 of the first circuit pattern.

Here, the second opening OR2 of the first protective layer 360 according to the first embodiment may vertically overlap a portion of the second portion 322 in the extension portion 320.

For example, the first portion 321 of the extension portion 320 may vertically overlap the first protective layer 360. In addition, a region of the second portion 322 adjacent to the first portion 321 of the extension portion 320 may also vertically overlap the first protective layer 360. In addition, a region adjacent to the dummy region except for the one region of the second portion of the extension portion 320 may vertically overlap the second opening OR2 of the first protective layer 360.

Next, as shown in FIG. 5I, the embodiment may proceed with a process of forming the first surface treatment layer 370 and the second surface treatment layer 380. For example, in the embodiment, a process of forming the first surface treatment layer 370 on the upper surface of the pad portion 310 that is vertically overlapped with the first opening OR1 of the first protective layer 360 may be performed using the plating lead 410 and the extension portion 320 connected to the plating lead 410.

In addition, the embodiment may proceed with a process of forming the second surface treatment layer 380 on the lower surface of the second circuit pattern that is vertically overlapped with the third opening OR3 of the second protective layer 380, in the same way as above.

Next, in the embodiment, as shown in FIGS. 5J and 5K, the sawing process is performed based on the sawing line SL, and a process of separating a plurality of unit regions manufactured in strip units, respectively, may be performed. Accordingly, in the embodiment, as the first unit region U1 and the second unit region U2 are separated from each other, a plurality of circuit boards may be simultaneously manufactured.

Thereafter, in the embodiment, as shown in FIG. 5L, a process of removing a region that does not vertically overlap with the first protective layer 360 among the extension portions 320 formed on the upper surface of the insulating layer 330 may be performed. For example, in the embodiment, as shown in FIG. 4L, a process of removing a region that vertically overlaps with the second opening OR2 of the first protective layer 360 among the extensions 320 formed on the upper surface of the insulating layer 330 may be performed. Accordingly, the upper surface of the insulating layer 330 in the embodiment may be formed a recess 330R connected to the second extension portion 320 while vertically overlapping with the second opening OR2 of the first protective layer 360.

—Circuit Board of the Second Embodiment—

Hereinafter, the circuit board of the second embodiment will be described.

The second embodiment has the same basic structure as the circuit board of the first embodiment, there is a difference in the shape of the extension portion 320 and the shape of the recess formed on the upper surface of the insulating layer 330 corresponding thereto as the size of the second opening OR2 formed in the first protective layer 360 is changed.

FIG. 6A is a cross-sectional view of a circuit board according to a second embodiment, and FIG. 6B is a plan view of the circuit board of the second embodiment as viewed from above.

In this case, in the embodiment, the same reference numerals are assigned to the components substantially the same as those of the first embodiment.

The insulating layer 330 may have a first width W1. The first width W1 may mean a horizontal distance between two outermost ends of the insulating layer 330 facing each other. The first protective layer 360 may have a second width W2. For example, the first protective layer 360 may have a second width W2 that is narrower than the first width W1 of the insulating layer 330. In this case, the first protective layer 360 having a narrower width than the insulating layer 330 is because a portion of the upper surface of the insulating layer 330 vertically overlaps the second opening OR2 of the first protective layer 360. In this case, the width of the second opening OR2 of the first protective layer 360 in the second embodiment may be greater than the width of the second opening OR2 of the first protective layer 360 in the first embodiment.

For example, the upper surface of the insulating layer 330 may be divided into a plurality of regions.

For example, an upper surface of the insulating layer 330 may include a first region R1 vertically overlapping with the first protective layer 360.

In addition, an upper surface of the insulating layer 330 in the first region R1 may be covered with the first protective layer 360.

In addition, the upper surface of the insulating layer 330 may include second regions R2 and R2-2 other than the first region R1. For example, an upper surface of the insulating layer 330 may include second regions R2 and R2-2 that do not vertically overlap the first protective layer 360. For example, the second regions R2 and R2-2 of the upper surface of the insulating layer 330 may mean a region that vertically overlaps with the second opening OR2 of the first protective layer 360.

In this case, the second regions R2 and R2-2 of the upper surface of the insulating layer 330 may be adjacent to the outermost end 330MS of the insulating layer 330. For example, the second regions R2 and R2-2 of the upper surface of the insulating layer 330 may be an edge region of the upper surface of the insulating layer 330 connected to the outermost end 330MS of the insulating layer 330.

In this case, the first circuit pattern includes a pad portion 310 and an extension portion 1320 connected to the pad portion 310. The pad portion 310 may be a mounting pad on which a chip is mounted or a terminal pad for connection with another external board, but is not limited thereto.

In addition, the extension portion 1320 may mean a trace connected to the pad portion 310, but is not limited thereto.

In this case, the extension portion 1320 of the first circuit pattern may be connected to the pad portion 310 and, accordingly, may extend toward the second regions R2 and R2-2 of the upper surface of the insulating layer 330. For example, the upper surface of the insulating layer 330 may include a plurality of extension portions, at least one of the extension portions may be connected to at least one of the pad portions 310, and thus may extend toward the second regions R2 and R2-2 of the upper surface of the insulating layer 330.

In this case, the extension portion 1320 may not include a step portion unlike the extension portion of the first embodiment. For example, the extension portion 1320 may have a first width and may be disposed on the insulating layer 330. For example, the extension 1320 in the second embodiment may include only the first portion 321 of the extension 320 in the first embodiment. This is because the second opening OR2 of the first protective layer 360 in the second embodiment is formed at the boundary between the first portion and the second portion of the extension 1320.

For example, the second opening OR2 of the first protective layer 360 in the second embodiment may vertically overlap the entire second portion except for the first portion of the extension portion in the manufacturing process of the circuit board. And, a portion corresponding to the second portion of the extension portion is removed in the final process of the circuit board, thereby remaining as a recess 1330R.

Accordingly, the recess 1330R in the second embodiment is connected to the first portion of the extension portion 1320, and thus may have a greater width than the first portion. That is, a step portion in the first embodiment is formed in the extension portion 1320. Alternatively, a step portion in the second embodiment may be formed between the extension 1320 and the recess 1330R.

—Circuit Board of the Third Embodiment—

Hereinafter, the circuit board of the third embodiment will be described.

The third embodiment has the same basic structure as the circuit board of the first embodiment, there is a difference in the shape of the extension portion 320 and the shape of the recess formed on the upper surface of the insulating layer 330 corresponding thereto as the size of the second opening OR2 formed in the first protective layer 360 is changed.

FIG. 7A is a cross-sectional view of a circuit board according to a third embodiment, and FIG. 7B is a plan view of the circuit board according to the third embodiment as viewed from above.

In this case, in the embodiment, the same reference numerals are assigned to the components substantially the same as those of the first embodiment.

The insulating layer 330 may have a first width W1. The first width W1 may mean a horizontal distance between two outermost ends of the insulating layer 330 facing each other. The first protective layer 360 may have a second width W2. For example, the first protective layer 360 may have a second width W2 that is narrower than the first width W1 of the insulating layer 330. In this case, the first protective layer 360 having a narrower width than the insulating layer 330 is because a portion of the upper surface of the insulating layer 330 vertically overlaps the second opening OR2 of the first protective layer 360. In this case, the width of the second opening OR2 of the first protective layer 360 in the third embodiment may be greater than the width of the second opening OR2 of the first protective layer 360 in the first and second embodiments.

For example, an upper surface of the insulating layer 330 may include a first region R1 vertically overlapping with the first protective layer 360.

In addition, an upper surface of the insulating layer 330 in the first region R1 may be covered with the first protective layer 360.

In addition, the upper surface of the insulating layer 330 may include second regions R2 and R2-2 other than the first region R1. For example, an upper surface of the insulating layer 330 may include second regions R2 and R2-2 that do not vertically overlap the first protective layer 360. For example, the second regions R2 and R2-2 of the upper surface of the insulating layer 330 may mean a region that vertically overlaps with the second opening OR2 of the first protective layer 360.

In this case, the second regions R2 and R2-2 of the upper surface of the insulating layer 330 may be adjacent to the outermost end 330MS of the insulating layer 330. For example, the second regions R2 and R2-2 of the upper surface of the insulating layer 330 may be an edge region of the upper surface of the insulating layer 330 connected to the outermost end 330MS of the insulating layer 330.

In this case, the first circuit pattern includes a pad portion 310 and an extension portion 2320 connected to the pad portion 310. The pad portion 310 may be a mounting pad on which a chip is mounted or a terminal pad for connection with another external board, but is not limited thereto.

In addition, the extension portion 2320 may mean a trace connected to the pad portion 310, but is not limited thereto.

In this case, the extension portion 2320 of the first circuit pattern may be connected to the pad portion 310 and, accordingly, may extend toward the second regions R2 and R2-2 of the upper surface of the insulating layer 330. For example, the upper surface of the insulating layer 330 may include a plurality of extension portions, at least one of the extension portions may be connected to at least one of the pad portions 310, and thus may extend toward the second regions R2 and R2-2 of the upper surface of the insulating layer 330.

In this case, the extension portion 2320 may not include a step portion unlike the extension portion of the first embodiment. For example, the extension portion 2320 may have a first width and may be disposed on the insulating layer 330. For example, the extension portion 2320 in the third embodiment may include only a part of the first portion 321 of the extension portion 320 in the first embodiment. This is because the second opening OR2 of the first protective layer 360 in the third embodiment is formed to vertically overlap a part of the first portion and the whole of the second portion of the extension portion 2320.

For example, in the third embodiment, a part of the second opening OR2 of the first protective layer 360 excluding a part of the first portion of the extension portion may vertically overlap the entire second portion in the manufacturing process of the circuit board. In addition, a part of the first portion and a portion corresponding to the second portion of the extension portion are removed in the final manufacturing process of the circuit board, thereby remaining as a recess 2330R.

Accordingly, the recess 2330R in the second embodiment is connected to the extension 2320. In this case, the recess 2330R may be divided into a plurality of parts.

For example, the recess 2330R may include a first recess 2330R1 adjacent to the extension 2320, and a second recess 2330R2 connected to the first recess 2330R1 and adjacent to the second regions R2 and R2-1 of the upper surface of the insulating layer 330.

The first recess 2330R is formed as a portion of the first portion of the extension portion is removed during the manufacturing process of the circuit board, and thus may have the same width as the extension portion 2320. In addition, the second recess 2330R2 is connected to the first recess 2330R1. The second recess 2330R2 is formed as the second portion of the extension portion 2320 is removed.

Accordingly, the first recess 2330R may have the same width as the extension portion 2320, and the second recess 2330R2 may be greater than the width of the extension portion 2320 and the first recess 2330R1.

For example, in the third embodiment, the recess 2330R may have a step portion. For example, the recess 2330R may have a stepped portion having a width widening in a region adjacent to the second regions R2 and R2-1 of the upper surface of the insulating layer 330.

The circuit board of the embodiment includes an insulating layer, a first circuit pattern disposed on the insulating layer, and a protective layer disposed on the insulating layer and having a width narrower than that of the insulating layer, wherein an upper surface of the insulating layer includes a first region overlapping the protective layer and a second region excluding the first region, wherein at least one of the first circuit pattern includes a pad portion, and an extension portion extending from the pad portion toward the second region, and wherein the extension portion includes a step portion having a width varying in a portion adjacent to the second region. Here, the step portion is characterized in that the width increases in a region adjacent to the second region of the upper surface of the insulating layer. That is, the extension portion includes a first portion adjacent to the pad portion and a second portion adjacent to the second region of the upper surface of the insulating layer, and a width of the second portion is greater than a width of the first portion. The embodiment can solve the void problem caused by the low density of the circuit pattern in the second region of the upper surface of the insulating layer when manufacturing the circuit board by the ETS method, and accordingly, the physical reliability of the circuit board may be improved.

Furthermore, the protective layer disposed on the upper surface of the insulating layer in the embodiment includes a second opening vertically overlapping with the second region of the insulating layer. In this case, the second opening may vertically overlap the protective layer disposed on a lower surface of the insulating layer. Preferably, the width of the protective layer on the upper surface of the insulating layer may be greater than a width of the protective layer on the lower surface of the insulating layer. Accordingly, the embodiment may minimize warpages occurring in a circuit board having an ETS structure having an asymmetric structure, and thus may improve physical reliability and electrical reliability of the circuit board.

On the other hand, when the circuit board having the above-described characteristics of the invention is used in an IT device or home appliance such as a smart phone, a server computer, a TV, and the like, functions such as signal transmission or power supply can be stably performed. For example, when the circuit board having the features of the present invention performs a semiconductor package function, it can function to safely protect the semiconductor chip from external moisture or contaminants, or alternatively, it is possible to solve problems of leakage current, electrical short circuit between terminals, and electrical opening of terminals supplied to the semiconductor chip. In addition, when the function of signal transmission is in charge, it is possible to solve the noise problem. Through this, the circuit board having the above-described characteristics of the invention can maintain the stable function of the IT device or home appliance, so that the entire product and the circuit board to which the present invention is applied can achieve functional unity or technical interlocking with each other.

When the circuit board having the characteristics of the invention described above is used in a transport device such as a vehicle, it is possible to solve the problem of distortion of a signal transmitted to the transport device, or alternatively, the safety of the transport device can be further improved by safely protecting the semiconductor chip that controls the transport device from the outside and solving the problem of leakage current or electrical short between terminals or the electrical opening of the terminal supplied to the semiconductor chip. Accordingly, the transportation device and the circuit board to which the present invention is applied can achieve functional integrity or technical interlocking with each other. Furthermore, when the circuit board having the above-described characteristics of the invention is used in a transportation device such as a vehicle, it is possible to transmit a high-current signal required by the vehicle at a high speed, thereby improving the safety of the transportation device. Furthermore, the circuit board and the semiconductor package including the same can be operated normally even in an unexpected situation occurring in various driving environments of the transportation device, thereby safely protecting the driver.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. A circuit board comprising:
an insulating layer;
a circuit pattern disposed on the insulating layer; and
a protective layer disposed on the insulating layer and having a width narrower than that of the insulating layer;
wherein an upper surface of the insulating layer includes a first region vertically overlapping with the protective layer, and a second region excluding the first region;
wherein the circuit pattern includes an extension portion extending from the first region to the second region; and
wherein a width of the extension portion in the second region is greater than a width of at least a part of the extension portion in the first region.

2. The circuit board of claim 1, wherein the extension portion includes a step portion having a width varying in a portion adjacent to the second region.

3. The circuit board of claim 1, wherein the circuit pattern includes a pad portion disposed in the first region;
wherein the extension portion includes:
a first portion positioned adjacent to the pad portion; and
a second portion disposed closer to the second region than the first portion; and
wherein a width of the first portion is different from a width of the second portion.

4. The circuit board of claim 3, wherein the width of the second portion of the extension portion is wider than the width of the first portion of the extension portion.

5. The circuit board of claim 1, wherein the second region includes an edge region of the upper surface of the insulating layer adjacent to an outermost end of the insulating layer.

6. The circuit board of claim 3, wherein the protective layer includes:
a first opening vertically overlapping with at least a part of an upper surface of the pad portion; and
a second opening vertically overlapping with the second region of the insulating layer; and
wherein the extension portion extends from the pad portion toward the second opening.

7. The circuit board of claim 6, further comprising:
a first surface treatment layer disposed on the upper surface of the pad portion vertically overlapping with the first opening.

8. The circuit board of claim 4, wherein the second region of the upper surface of the insulating layer is provided with a recess concave toward a lower surface of the insulating layer.

9. The circuit board of claim 8, wherein the recess is connected to one end of the second portion of the extension portion and an outermost end of the insulating layer.

10. The circuit board of claim 9, wherein a width of the recess is equal to the width of the second portion of the extension portion.

11. The circuit board of claim 9, wherein a lower surface of the recess is positioned on the same plane as a lower surface of the extension portion.

12. A circuit board comprising:
an insulating layer; and
a circuit pattern disposed on the insulating layer;
wherein the circuit pattern includes:
a pad portion; and
an extension portion extending from the pad portion toward an outermost end of the insulating layer; and
wherein the extension portion includes a step portion having a width varying in a portion adjacent to the outermost end portion.

13. The circuit board of claim 12, further comprising:
a protective layer disposed on the insulating layer;
wherein the extension portion includes:
a first portion positioned adjacent to the pad portion and vertically overlapping the protective layer; and
a second portion disposed between the first portion and the outermost end of the insulating layer and vertically overlapping the insulating layer; and
wherein a width of the second portion is greater than a width of the first portion.

14. The circuit board of claim 12, further comprising:
a protective layer disposed on the insulating layer;
wherein an upper surface of the insulating layer includes:
a first region vertically overlapping with the protective layer; and
a second region excluding the first region;
wherein the extension portion includes:
a first portion positioned adjacent to the pad portion; and
a second portion disposed closer to the second region than the first portion; and
wherein a width of the second portion is greater than a width of the first portion.

15. The circuit board of claim 14, wherein the protective layer includes an opening vertically overlapping with the second region of the insulating layer;
wherein a recess provided in the second region of the upper surface of the insulating layer; and wherein the recess vertically overlaps with the opening of the protective layer and is concave toward a lower surface of the insulating layer.

16. A circuit board comprising:

an insulating layer;

a circuit pattern disposed on the insulating layer; and a protective layer disposed on the insulating layer;

wherein an upper surface of the insulating layer includes:

a first region vertically overlapping with the protective layer; and a second region excluding the first region;

wherein the circuit pattern includes:

a pad portion; and an extension portion extending from the pad portion toward the second region;

wherein a recess is provided in the second region of the upper surface of the insulating layer; and wherein the recess is concave toward a lower surface of the insulating layer, has a different width than the extension portion, and is connected to the extension portion.

17. The circuit board of claim 16, wherein the recess has a width wider than a width of the extension portion, and is connected to an outermost end of the insulating layer.

18. A circuit board comprising:

an insulating layer;

a circuit pattern disposed on the insulating layer; and a protective layer disposed on the insulating layer;

wherein an upper surface of the insulating layer includes:

a first region vertically overlapping with the protective layer, and a second region excluding the first region;

wherein the circuit pattern includes:

a pad portion; and an extension portion extending from the pad portion toward the second region; and wherein the second region of the upper surface of the insulating layer includes a recess concave toward a lower surface of the insulating layer and including a step portion having a width varying in a portion adjacent to the second region.

19. The circuit board of claim 18, wherein the recess includes:

a first recess adjacent the extension portion; and a second recess adjacent to an outermost end of the insulating layer; and wherein a width of the first recess is different from a width of the second recess.

20. The circuit board of claim 19, wherein the width of the first recess is equal to a width of the extension portion; and wherein the width of the second recess is greater than a width of the extension portion and a width of the first recess.

* * * * *